(12) United States Patent
Yu et al.

(10) Patent No.: US 10,014,316 B2
(45) Date of Patent: Jul. 3, 2018

(54) THREE-DIMENSIONAL MEMORY DEVICE WITH LEAKAGE REDUCING SUPPORT PILLAR STRUCTURES AND METHOD OF MAKING THEREOF

(71) Applicant: SANDISK TECHNOLOGIES LLC, Plano, TX (US)

(72) Inventors: Fabo Yu, San Ramon, CA (US); Jayavel Pachamuthu, San Jose, CA (US); Jongsun Sel, Los Gatos, CA (US); Tuan Pham, San Jose, CA (US); Cheng-Chung Chu, Milpitas, CA (US); Yao-Sheng Lee, Tampa, FL (US); Kensuke Yamaguchi, Yokkaichi (JP); Masanori Terahara, Yokkaichi (JP); Shuji Minagawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/296,380

(22) Filed: Oct. 18, 2016

(65) Prior Publication Data
US 2018/0108671 A1 Apr. 19, 2018

(51) Int. Cl.
*H01L 27/115* (2017.01)
*H01L 21/768* (2006.01)
(Continued)

(52) U.S. Cl.
CPC .. *H01L 27/11575* (2013.01); *H01L 21/76229* (2013.01); *H01L 27/11548* (2013.01);
(Continued)

(58) Field of Classification Search
CPC ......... H01L 27/11519; H01L 27/11524; H01L 27/11548; H01L 27/11556;
(Continued)

(56) References Cited

U.S. PATENT DOCUMENTS 5,915,167 A 6/1999 Leedy
8,884,357 B2 11/2014 Wang et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Kimberly Rizkallah
*Assistant Examiner* — Brian Turner
(74) *Attorney, Agent, or Firm* — The Marbury Law Group PLLC

(57) ABSTRACT

Memory openings and support openings can be formed through an alternating stack of insulating layers and sacrificial material layers. A set of dielectric layers and at least one semiconductor material layer can be sequentially deposited in each of the memory openings and the support openings. The at least one semiconductor material layer is removed from inside the support openings, while the at least one semiconductor material layer is not removed from inside the memory openings. Memory stack structures and support pillar structures are formed in the memory openings and the support openings, respectively. The sacrificial material layers are replaced with electrically conductive layers. Removal of the at least one semiconductor material layer from the support pillar structures reduces or eliminates leakage current through the support pillar structures.

23 Claims, 37 Drawing Sheets

(51) Int. Cl.

| | |
|---|---|
| *H01L 23/532* | (2006.01) |
| *H01L 21/336* | (2006.01) |
| *H01L 29/167* | (2006.01) |
| *H01L 21/28* | (2006.01) |
| *H01L 27/11575* | (2017.01) |
| *H01L 27/11548* | (2017.01) |
| *H01L 27/11582* | (2017.01) |
| *H01L 27/11556* | (2017.01) |
| *H01L 29/06* | (2006.01) |
| *H01L 21/762* | (2006.01) |

(52) U.S. Cl.
CPC .. *H01L 27/11556* (2013.01); *H01L 27/11582* (2013.01); *H01L 29/0607* (2013.01); *H01L 29/0649* (2013.01)

(58) Field of Classification Search
CPC ........... H01L 27/11565; H01L 27/1157; H01L 27/11575; H01L 27/11582; H01L 21/28273; H01L 21/28282
See application file for complete search history.

(56) References Cited

U.S. PATENT DOCUMENTS

| | | | |
|---|---|---|---|
| 8,946,023 | B2 | 2/2015 | Makala et al. |
| 9,023,719 | B2 | 5/2015 | Pachamuthu et al. |
| 9,230,973 | B2 | 1/2016 | Pachamuthu et al. |
| 9,230,979 | B1 | 1/2016 | Pachamuthu et al. |
| 9,230,987 | B2 | 1/2016 | Pachamuthu et al. |
| 9,455,263 | B2 | 9/2016 | Zhang et al. |
| 2015/0076580 | A1 | 3/2015 | Pachamuthu et al. |
| 2015/0118811 | A1 | 4/2015 | Makala et al. |
| 2015/0294978 | A1 | 10/2015 | Lu et al. |
| 2016/0049423 | A1 | 2/2016 | Yoo et al. |
| 2016/0204117 | A1 | 7/2016 | Liu et al. |
| 2016/0268209 | A1 | 9/2016 | Pachamuthu et al. |
| 2016/0343434 | A1* | 11/2016 | Lee .................... G11C 13/0026 |
| 2017/0047340 | A1* | 2/2017 | Huo .................. H01L 27/11556 |
| 2017/0170191 | A1* | 6/2017 | Lee .................... H01L 27/0207 |
| 2017/0207232 | A1* | 7/2017 | You .................... H01L 27/11521 |
| 2017/0278860 | A1* | 9/2017 | Aoyama ........... H01L 27/11582 |

OTHER PUBLICATIONS

Wong, M. et al., "Water Temperature Dependence of the Vapor-Phase HF Oxide Etch," J. Electrochem., Soc., vol. 140, No. 1, pp. 205-208, (1993).
U.S. Appl. No. 14/834,830, filed Aug. 25, 2015, SanDisk Technologies Inc.
U.S. Appl. No. 14/834,943, filed Aug. 25, 2015, SanDisk Technologies Inc.
U.S. Appl. No. 14/862,916, filed Sep. 23, 2015, SanDisk Technologies Inc.
U.S. Appl. No. 14/883,966, filed Oct. 15, 2015, SanDisk Technologies Inc.
U.S. Appl. No. 14/927,708, filed Oct. 30, 2015, SanDisk Technologies Inc.
U.S. Appl. No. 14/927,990, filed Oct. 30, 2015, SanDisk Technologies Inc.
U.S. Appl. No. 14/989,206, filed Jan. 6, 2016, SanDisk Technologies Inc.
U.S. Appl. No. 15/015,190, filed Feb. 4, 2016, SanDisk Technologies Inc.
U.S. Appl. No. 15/071,575, filed Mar. 16, 2016, SanDisk Technologies Inc.
U.S. Appl. No. 15/183,195, filed Jun. 15, 2016, SanDisk Technologies LLC.
U.S. Appl. No. 15/186,768, filed Jun. 20, 2016, SanDisk Technologies LLC.
U.S. Appl. No. 15/198,175, filed Jun. 30, 2016, SanDisk Technologies LLC.

* cited by examiner

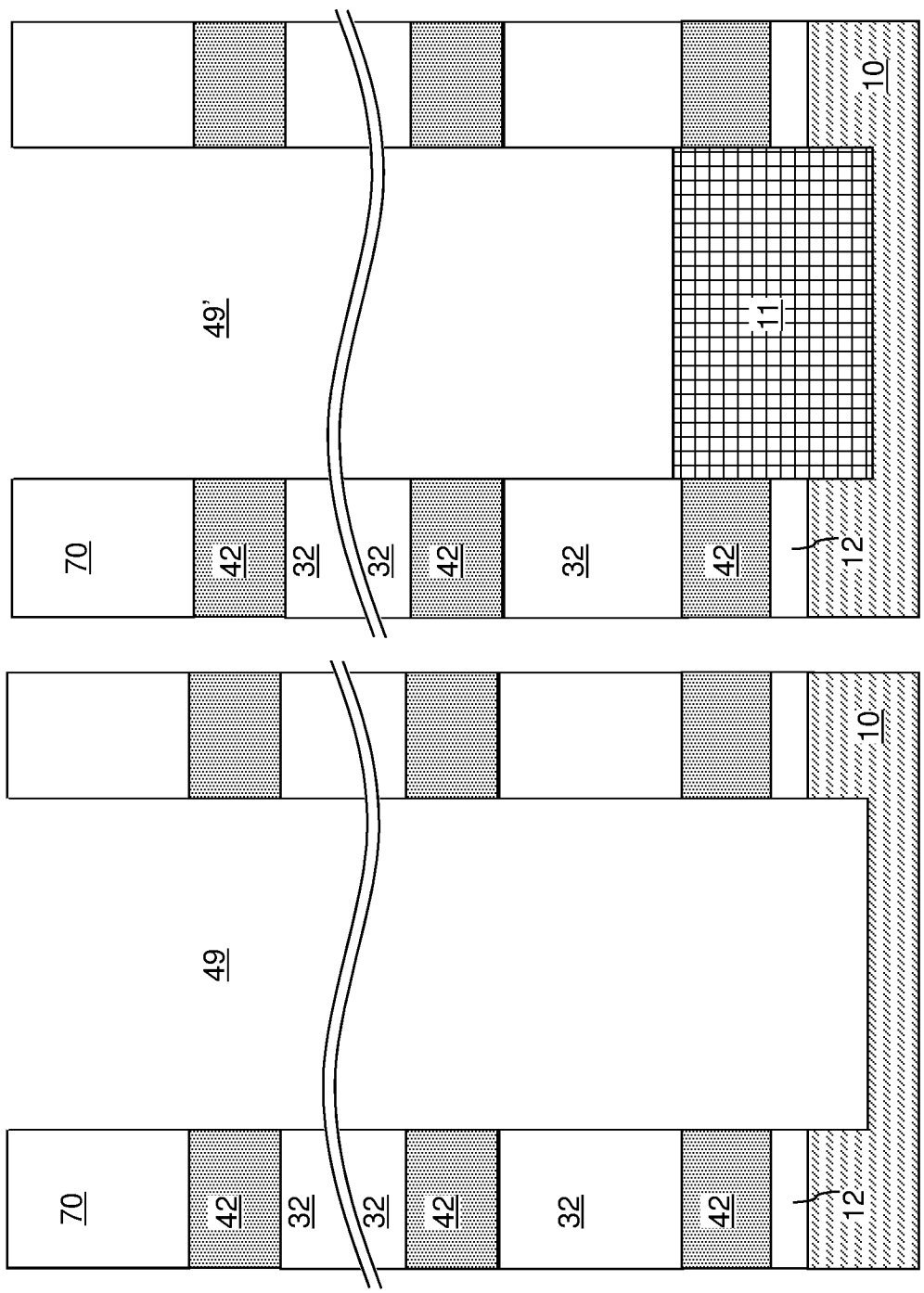

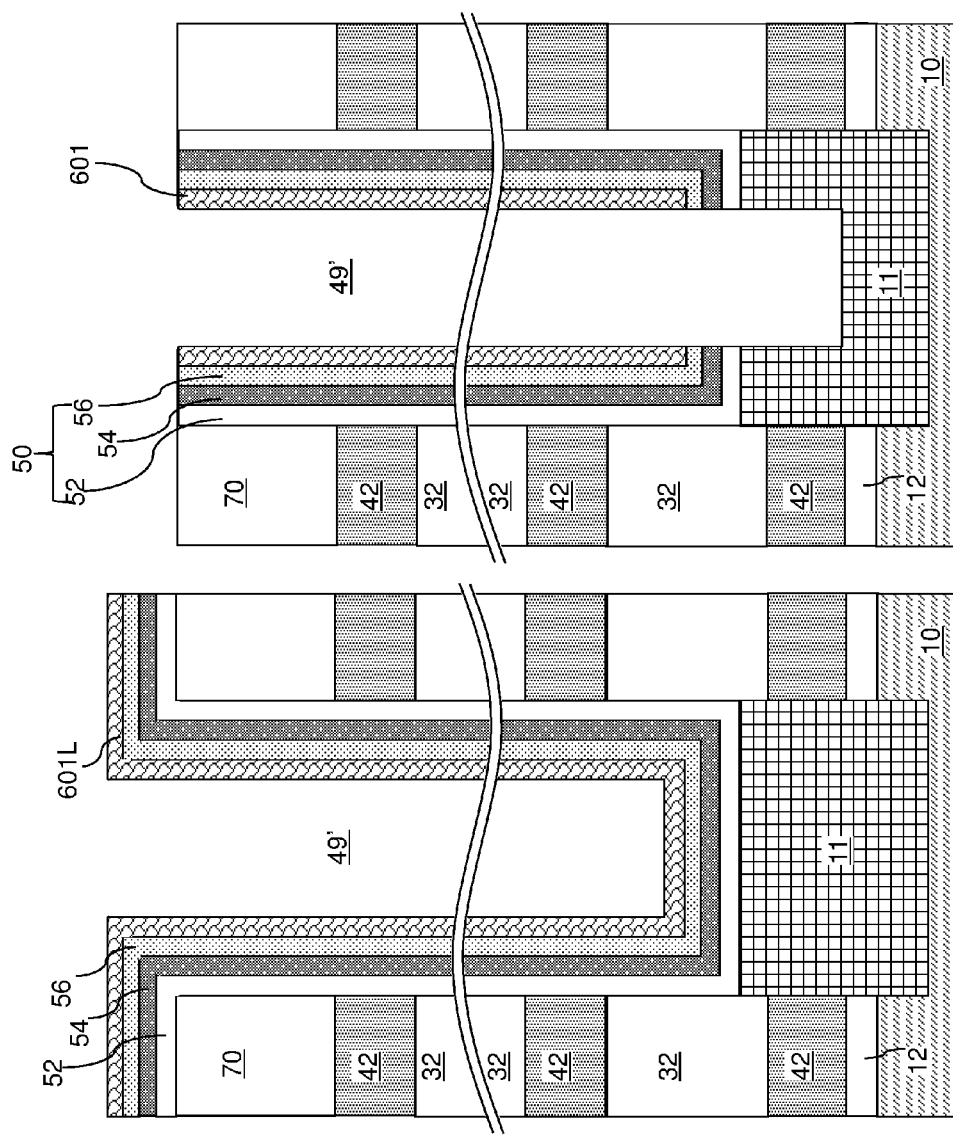

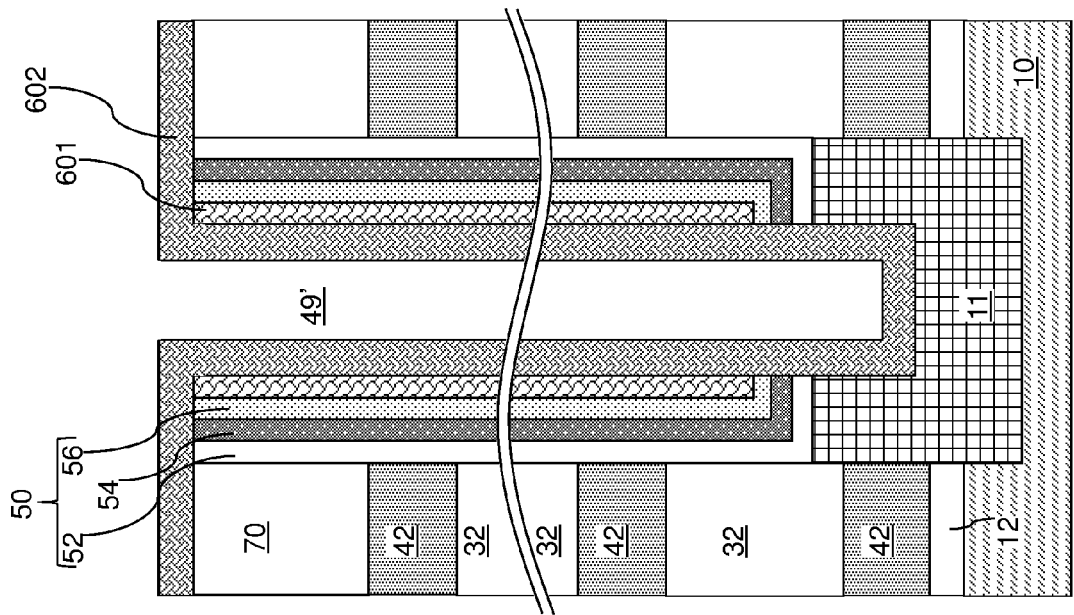
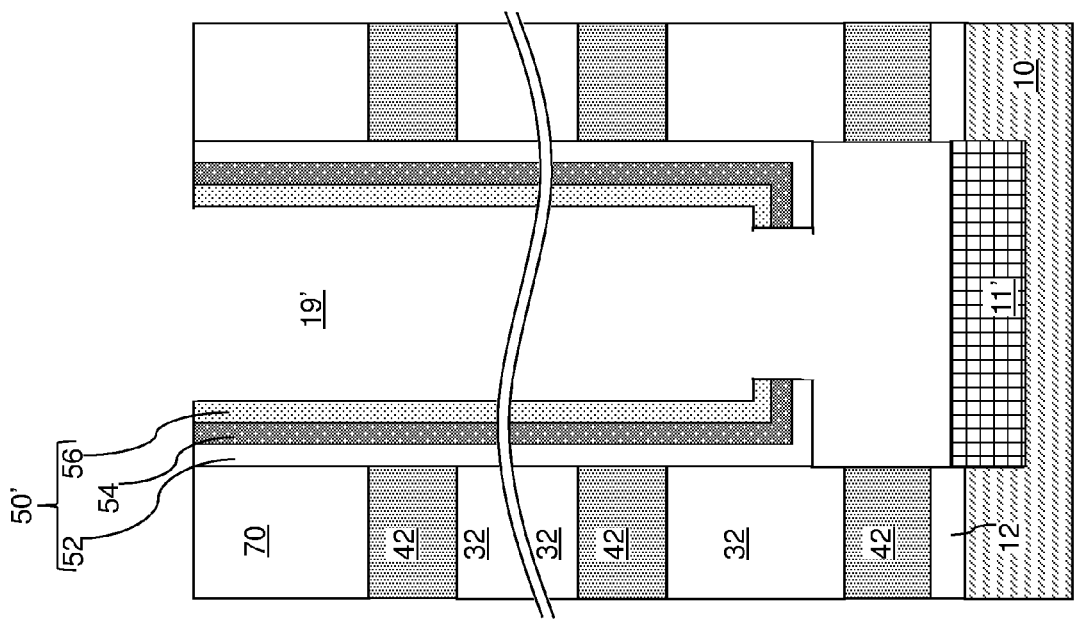

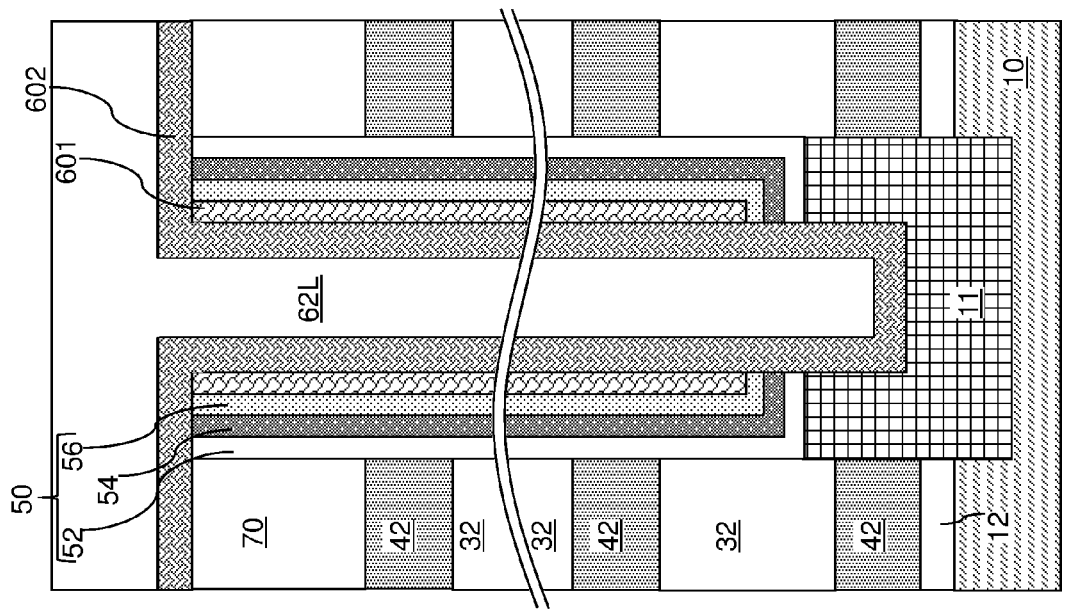
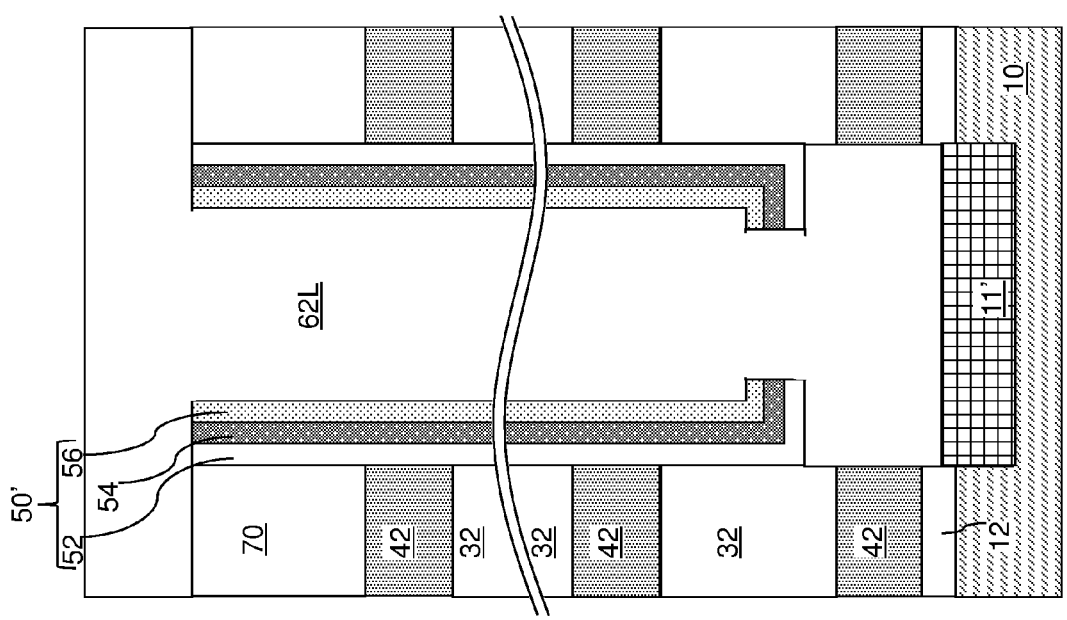

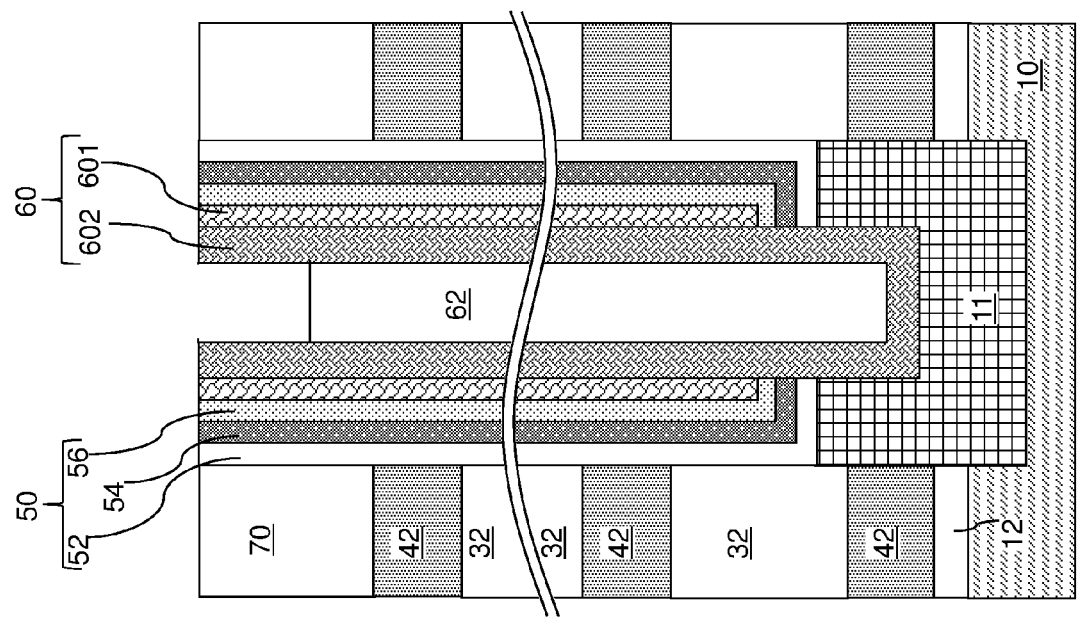
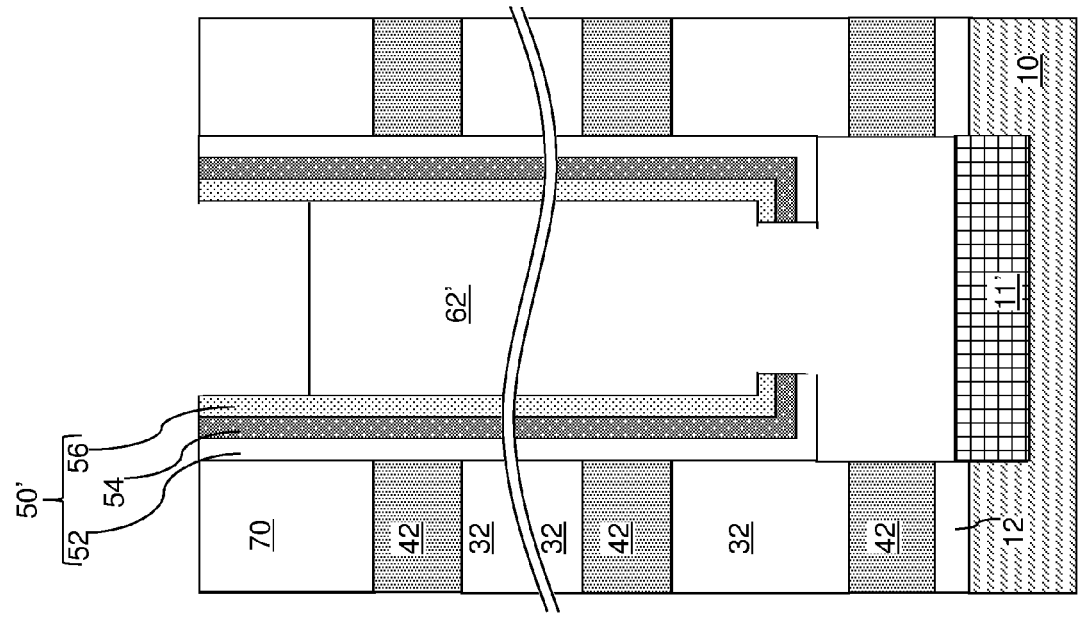

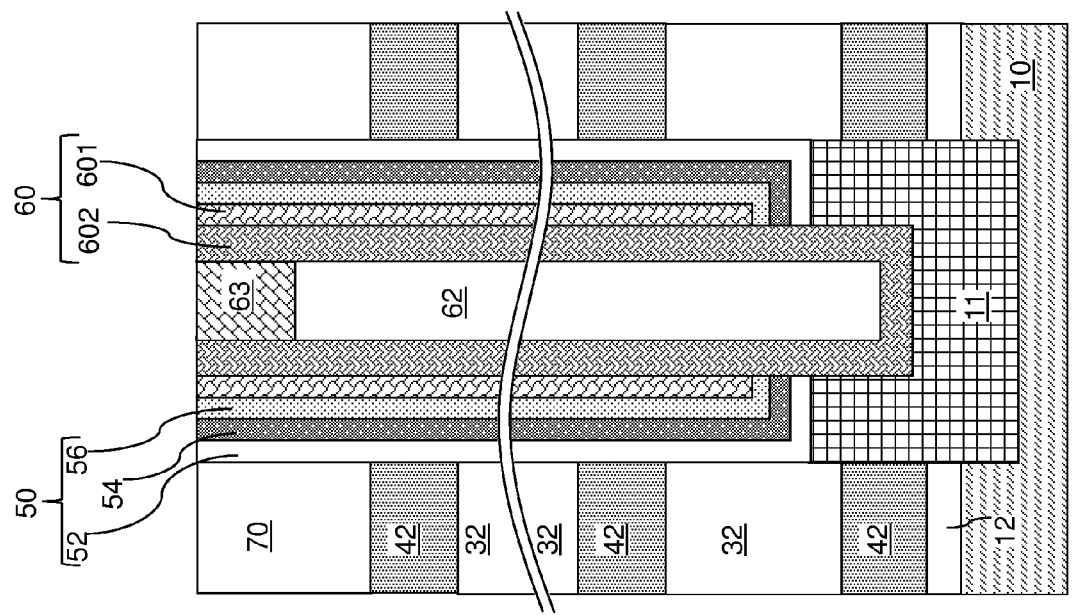
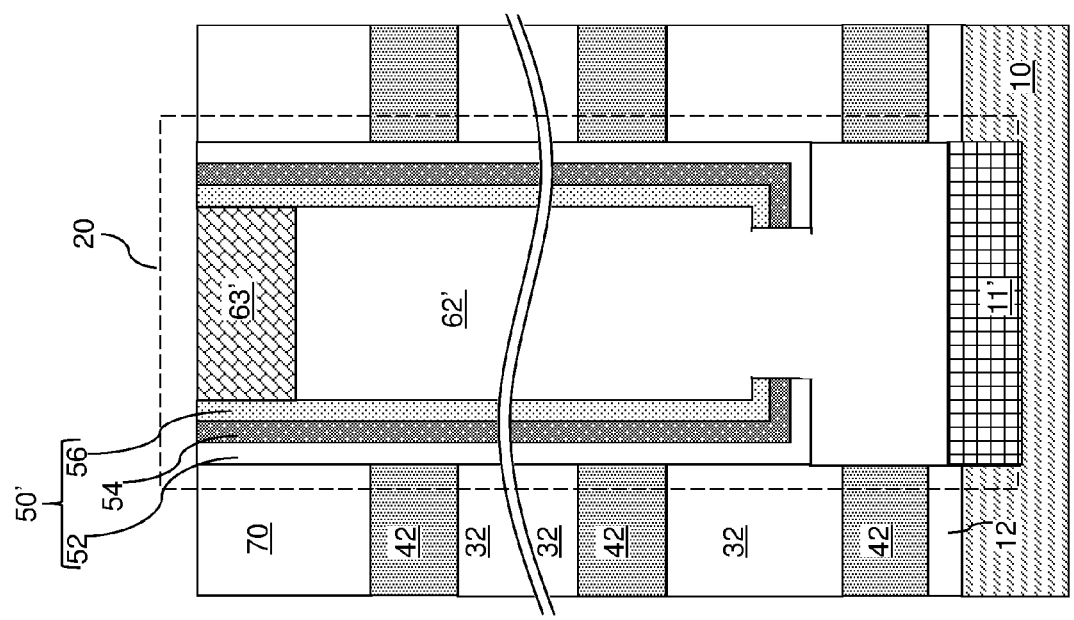

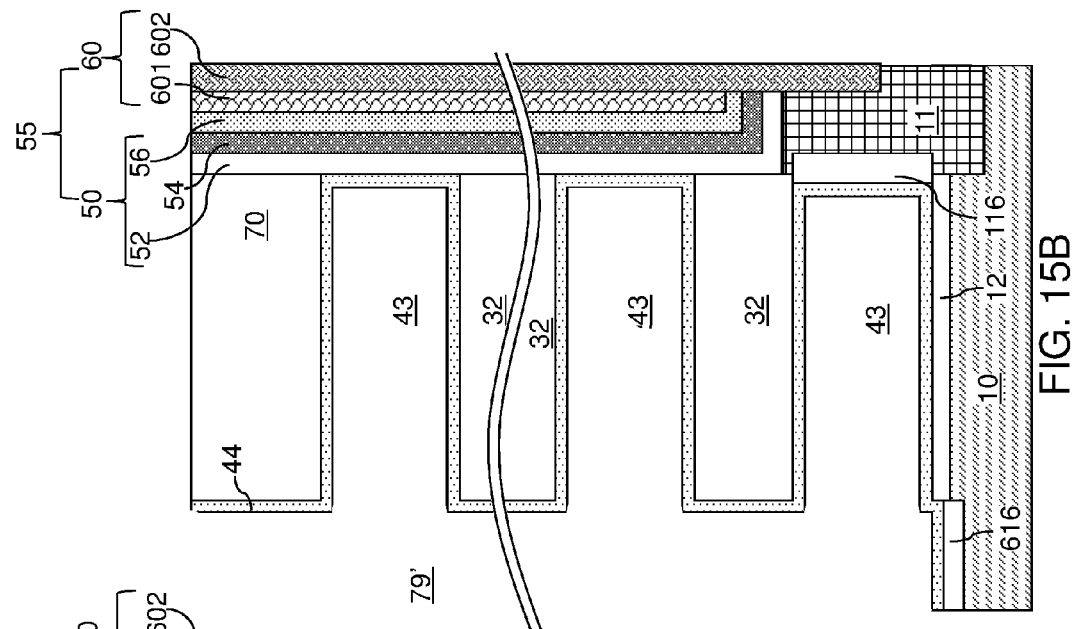
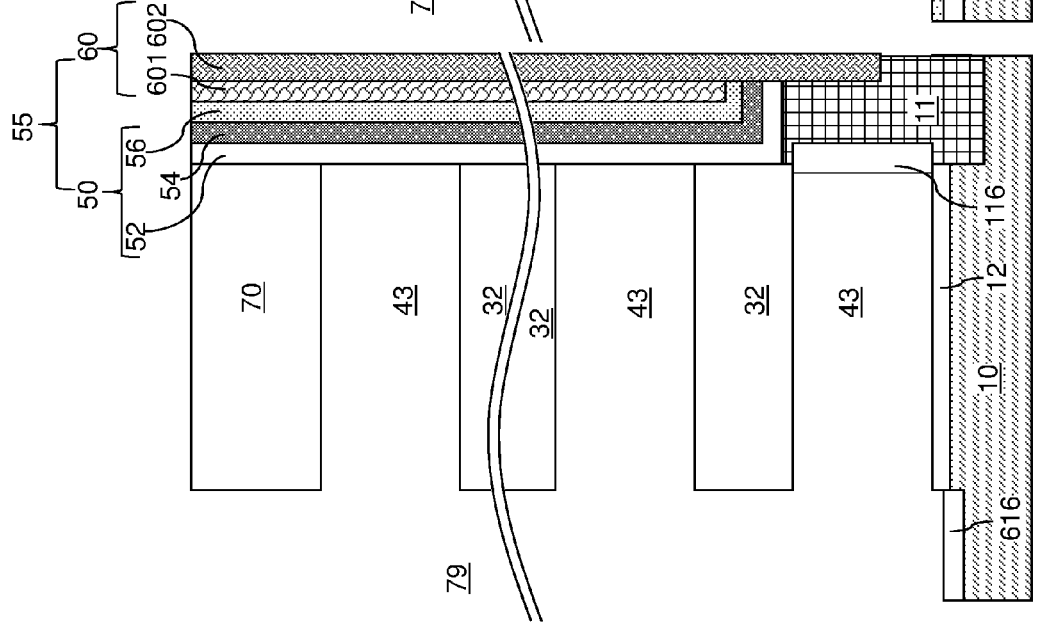
FIG. 15A
FIG. 15B

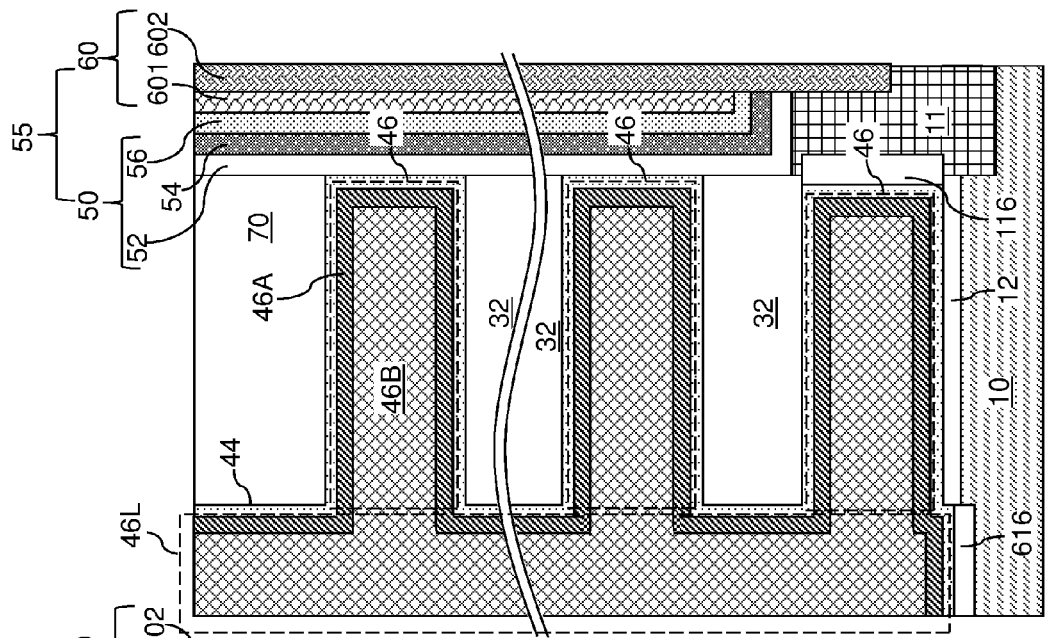
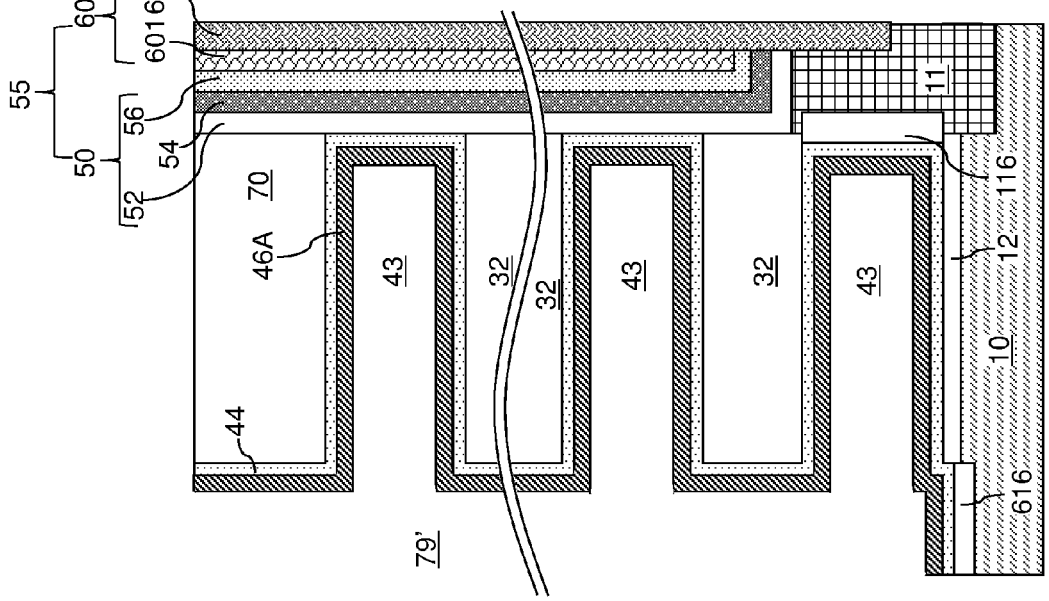

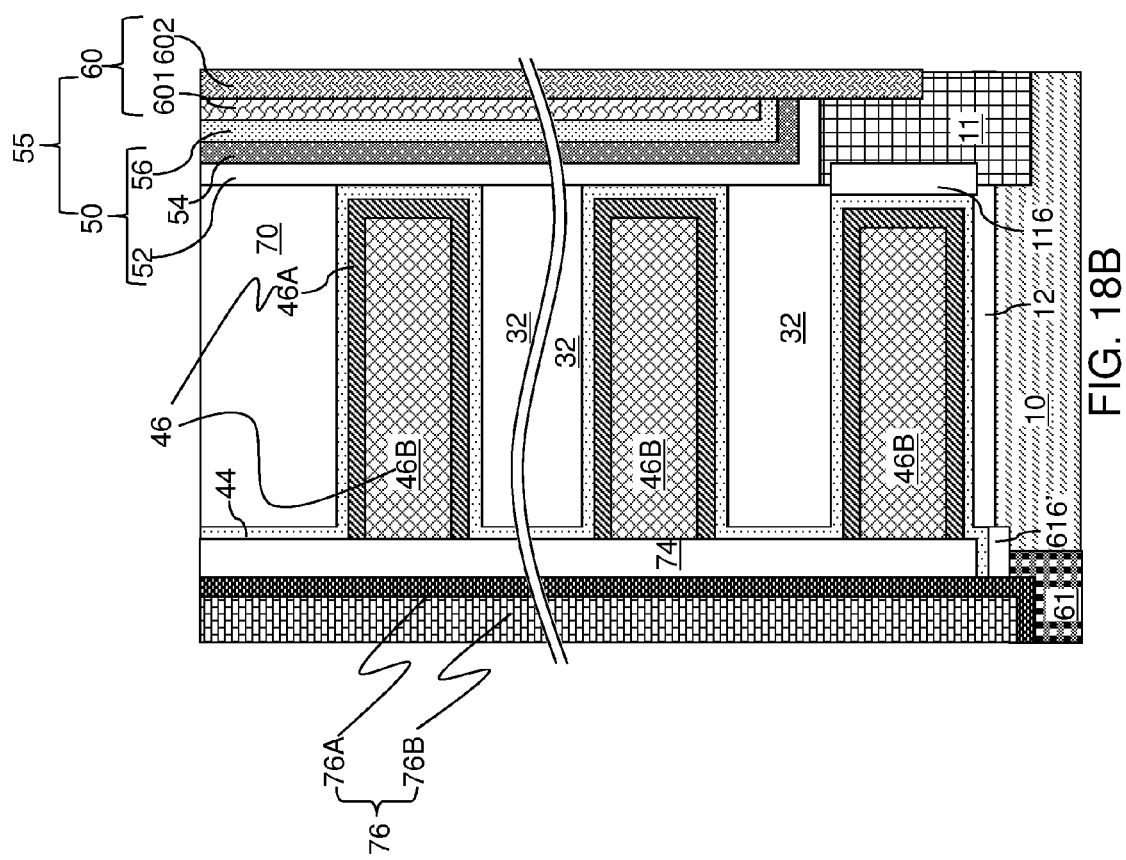

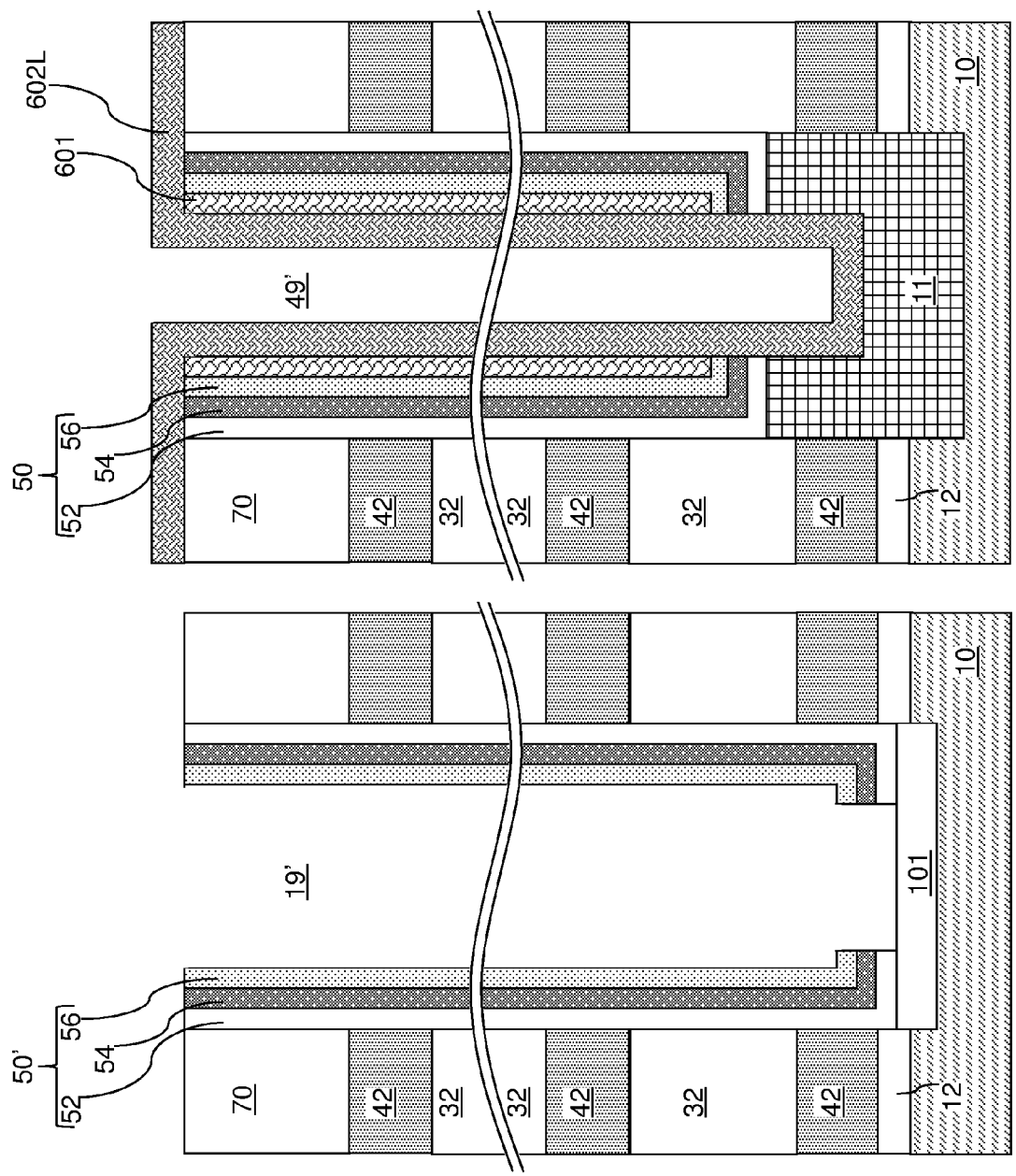

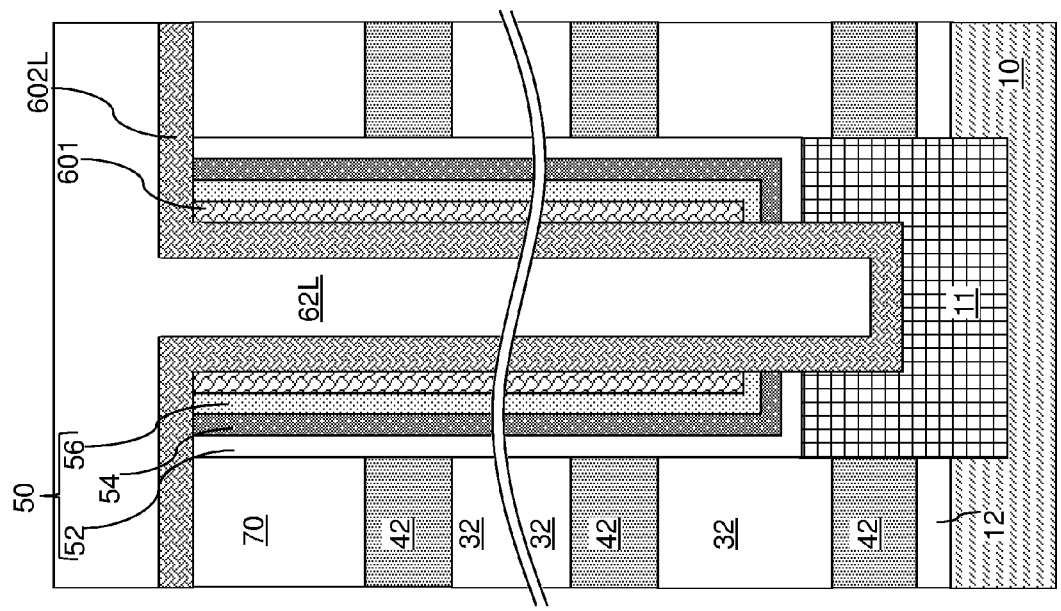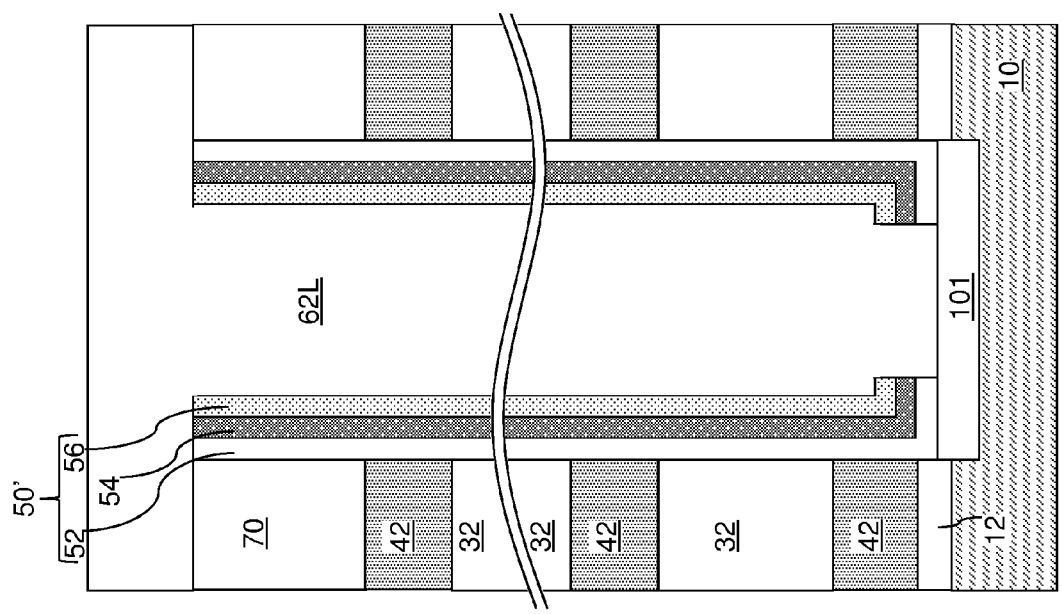

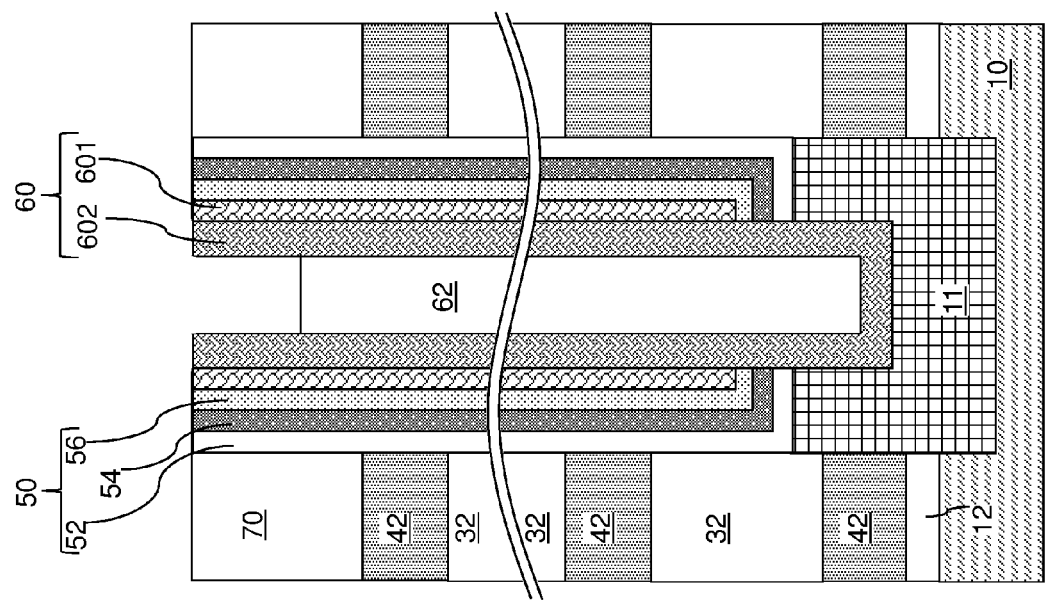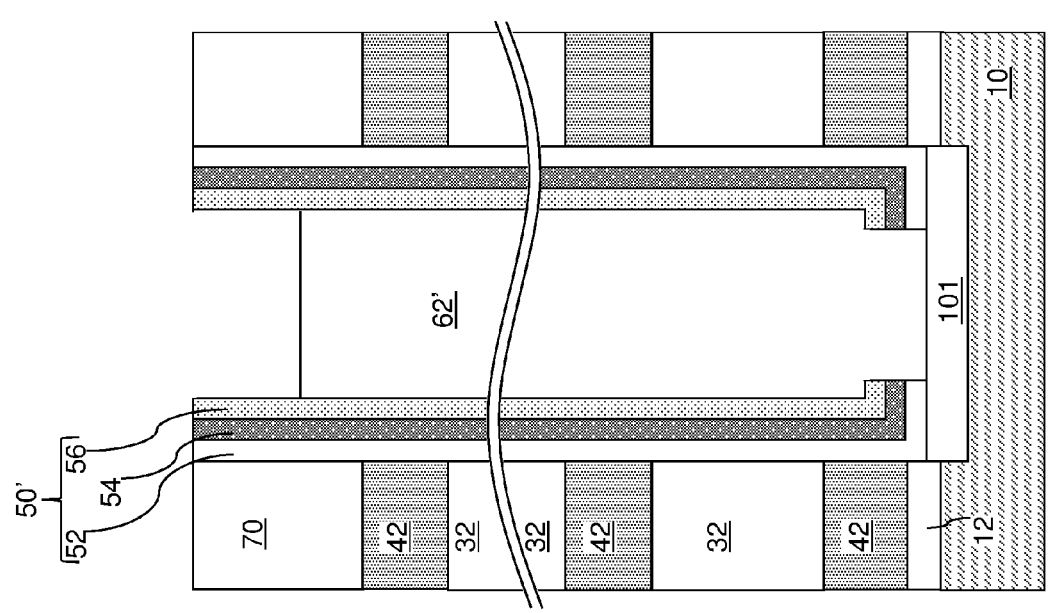

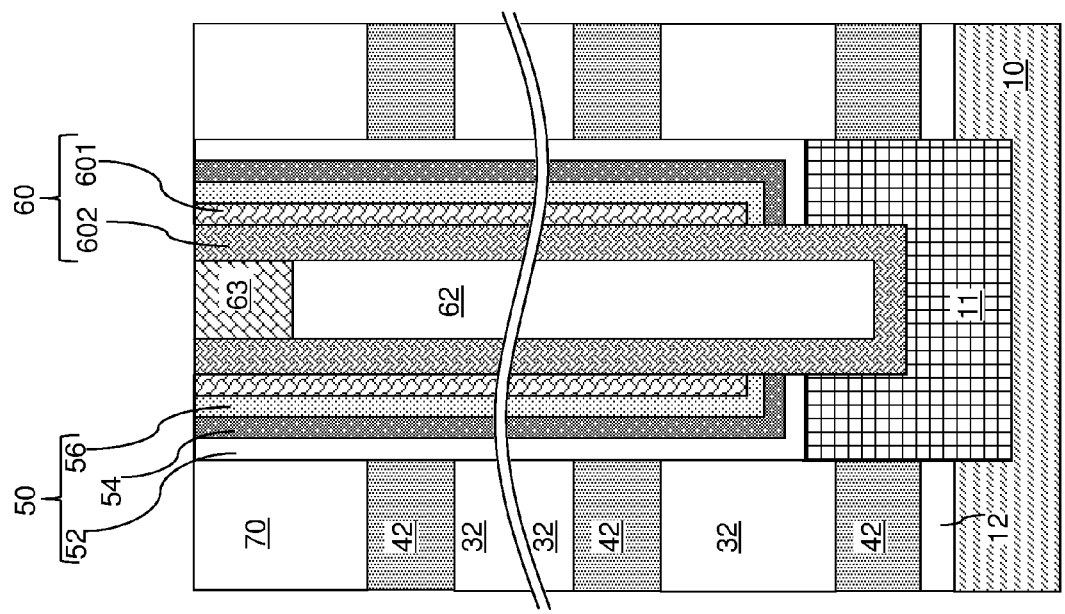
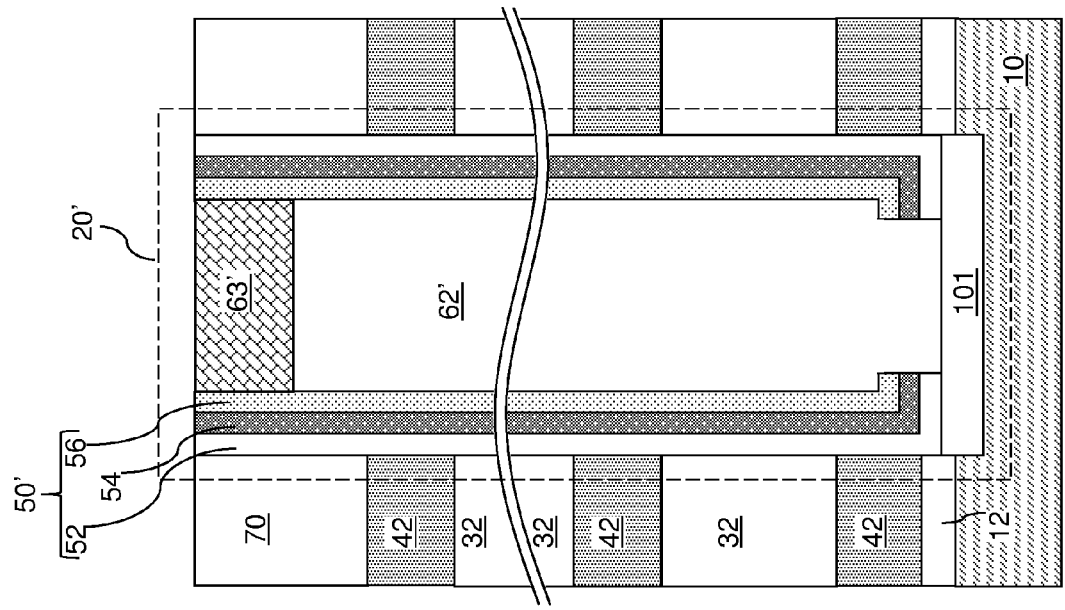

THREE-DIMENSIONAL MEMORY DEVICE WITH LEAKAGE REDUCING SUPPORT PILLAR STRUCTURES AND METHOD OF MAKING THEREOF

FIELD

The present disclosure relates generally to the field of semiconductor devices, and particular to a three-dimensional memory device employing support pillar structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36. For devices in which semiconductor materials are employed to provide support pillar structures, the semiconductor material can provide a leakage path among electrically conductive lines, which can deleterious to yield and/or reliability of a three-dimensional memory device.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises a memory film, a vertical semiconductor channel contacting an inner sidewall of the memory film, and a dielectric core contacting an inner sidewall of the vertical semiconductor channel; and support pillar structures extending through the alternating stack and laterally spaced from the memory stack structures, wherein each of the support pillar structures comprises a dielectric layer stack and a dielectric fill material portion that contacts an inner sidewall of the dielectric layer stack.

According to another aspect of the present disclosure, a method of forming a three-dimensional memory device is provided. An alternating stack of insulating layers and sacrificial material layers is formed over a substrate. Memory openings and support openings are formed through the alternating stack. A set of dielectric layers and at least one semiconductor material layer are sequentially deposited in each of the memory openings and the support openings. The at least one semiconductor material layer is removed from inside the support openings, while not removing the at least one semiconductor material layer from inside the memory openings. Memory stack structures and support pillar structures are formed in the memory openings and the support openings, respectively, by depositing additional material portions in the memory openings and the support openings. The sacrificial material layers are formed with electrically conductive layers.

BRIEF DESCRIPTION OF THE DRAWINGS

FIGS. 5A-5E are sequential schematic vertical cross-sectional views of a memory opening within the first exemplary structure up to the processing step of deposition of a second semiconductor channel layer according to the first embodiment of the present disclosure.

FIG. 8A is a vertical cross-sectional view of a support opening at the processing step of FIG. 7.

FIG. 8B is a vertical cross-sectional view of a memory opening at the processing step of FIG. 7.

FIG. 9A is a vertical cross-sectional view of a support opening after deposition of a dielectric material layer according to the first embodiment of the present disclosure.

FIG. 9B is a vertical cross-sectional view of a memory opening after deposition of a dielectric material layer according to the first embodiment of the present disclosure.

FIG. 10A is a vertical cross-sectional view of a support opening after recessing the dielectric material layer to form a dielectric material fill portion according to the first embodiment of the present disclosure.

FIG. 10B is a vertical cross-sectional view of a memory opening after recessing the dielectric material layer to form a dielectric core according to the first embodiment of the present disclosure.

FIG. 11A is a vertical cross-sectional view of a support opening after formation of a dummy drain region according to the first embodiment of the present disclosure.

FIG. 11B is a vertical cross-sectional view of a memory opening after formation of a drain region according to the first embodiment of the present disclosure.

FIGS. 15A-15D are sequential vertical cross-sectional views of a region of the first exemplary structure during formation of electrically conductive layers according to the first embodiment of the present disclosure.

FIG. 18B is a magnified view of a region of the first exemplary structure of FIG. 18A.

FIG. 25A is a vertical cross-sectional view of a support opening at the processing step of FIG. 24.

FIG. 25B is a vertical cross-sectional view of a memory opening at the processing step of FIG. 24.

FIG. 26A is a vertical cross-sectional view of a support opening after deposition of a dielectric material layer according to the second embodiment of the present disclosure.

FIG. 26B is a vertical cross-sectional view of a memory opening after deposition of a dielectric material layer according to the second embodiment of the present disclosure.

FIG. 27A is a vertical cross-sectional view of a support opening after recessing the dielectric material layer to form a dielectric material fill portion according to the second embodiment of the present disclosure.

FIG. 27B is a vertical cross-sectional view of a memory opening after recessing the dielectric material layer to form a dielectric core according to the second embodiment of the present disclosure.

FIG. 28A is a vertical cross-sectional view of a support opening after formation of a dummy drain region according to the second embodiment of the present disclosure.

FIG. 28B is a vertical cross-sectional view of a memory opening after formation of a drain region according to the second embodiment of the present disclosure.

DETAILED DESCRIPTION

Figure 1:
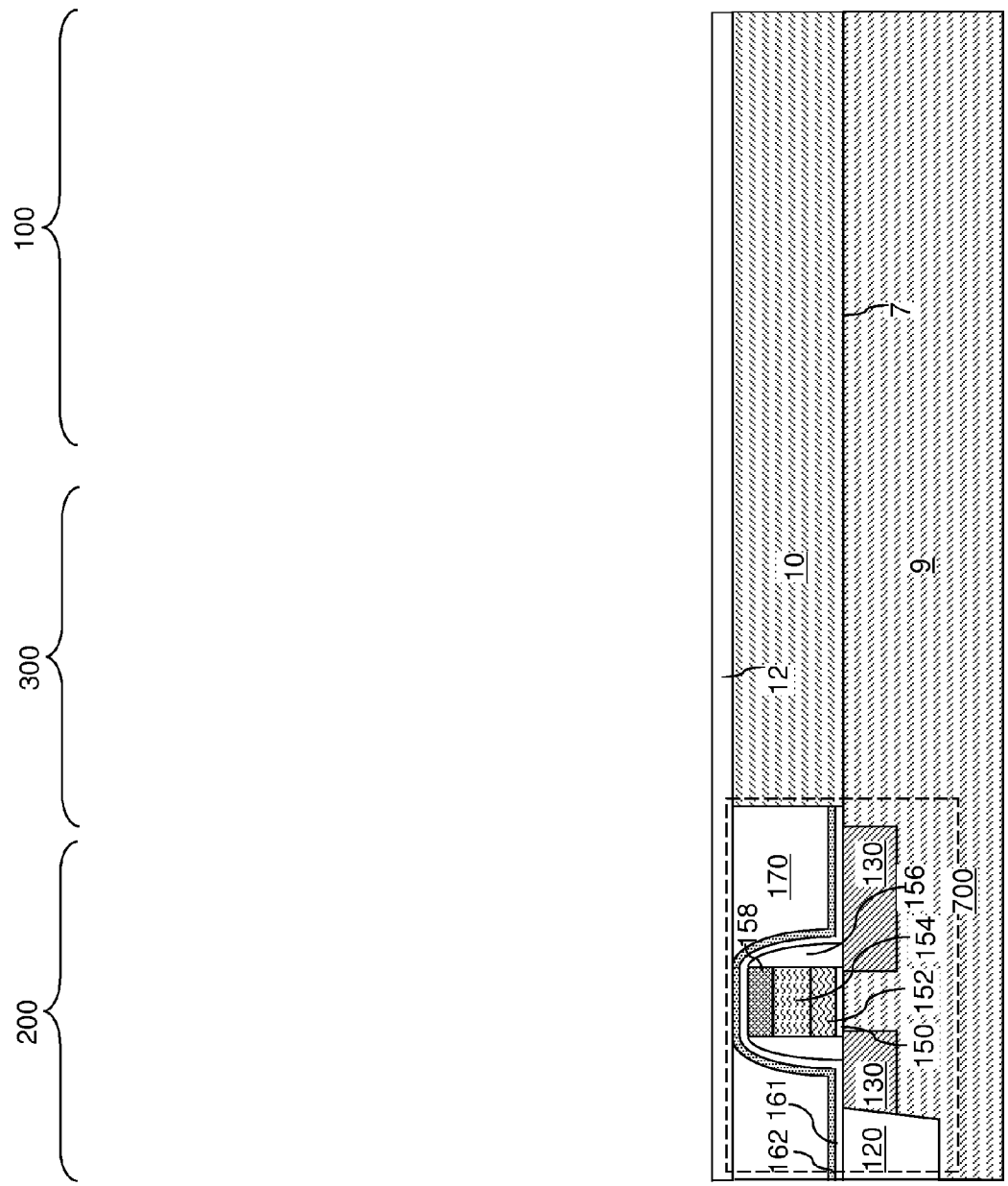
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

The various embodiments of the present disclosure can be employed to reduce interlevel leakage current caused by support pillar structures that support the alternating stack during replacement of sacrificial material layers with electrically conductive layers.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
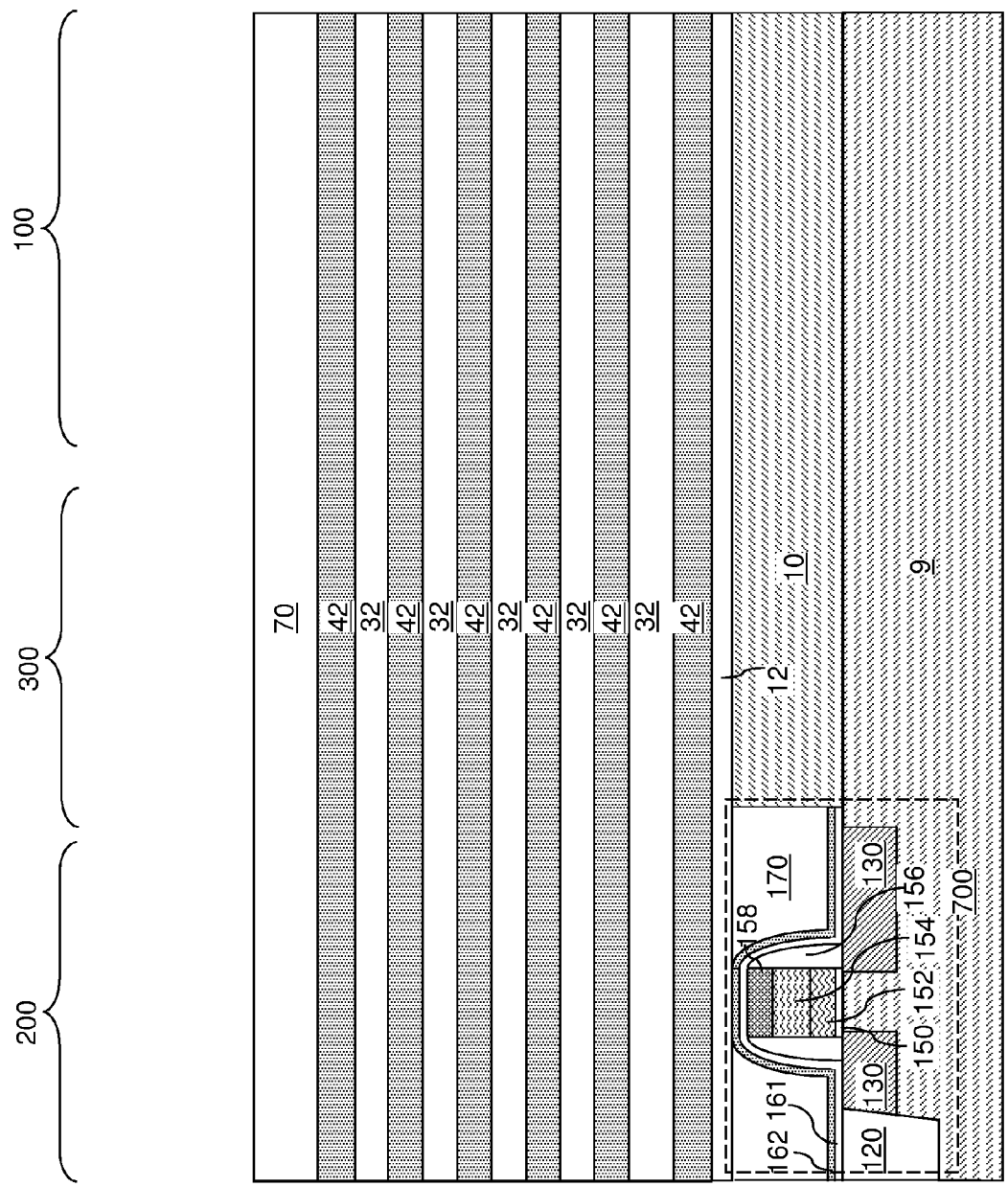
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
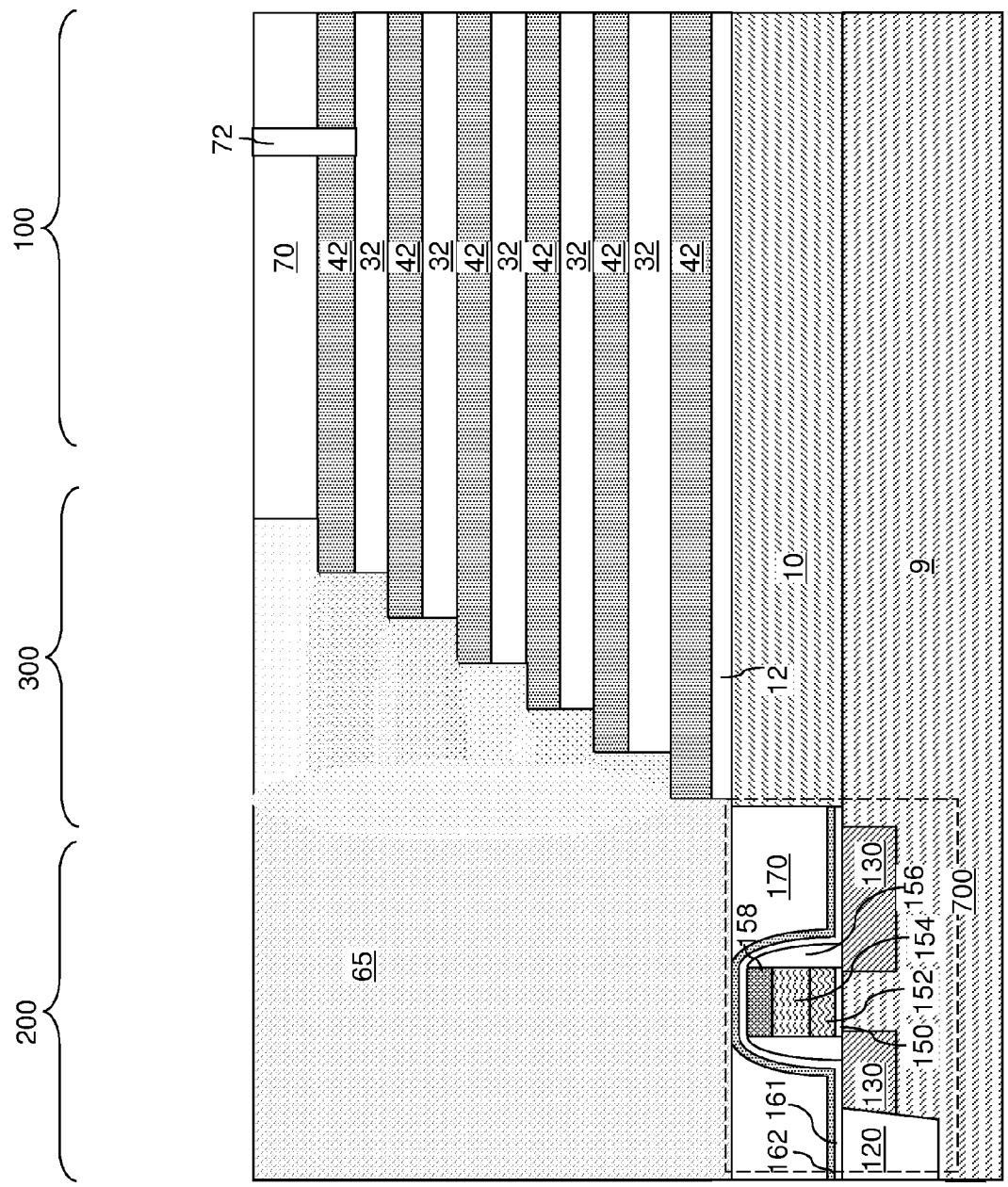
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the memory array region (e.g., device region) 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70. Alternatively the drain select level isolation structures 72 can be formed at a later step in the process or be omitted entirely.

Figure 4A:
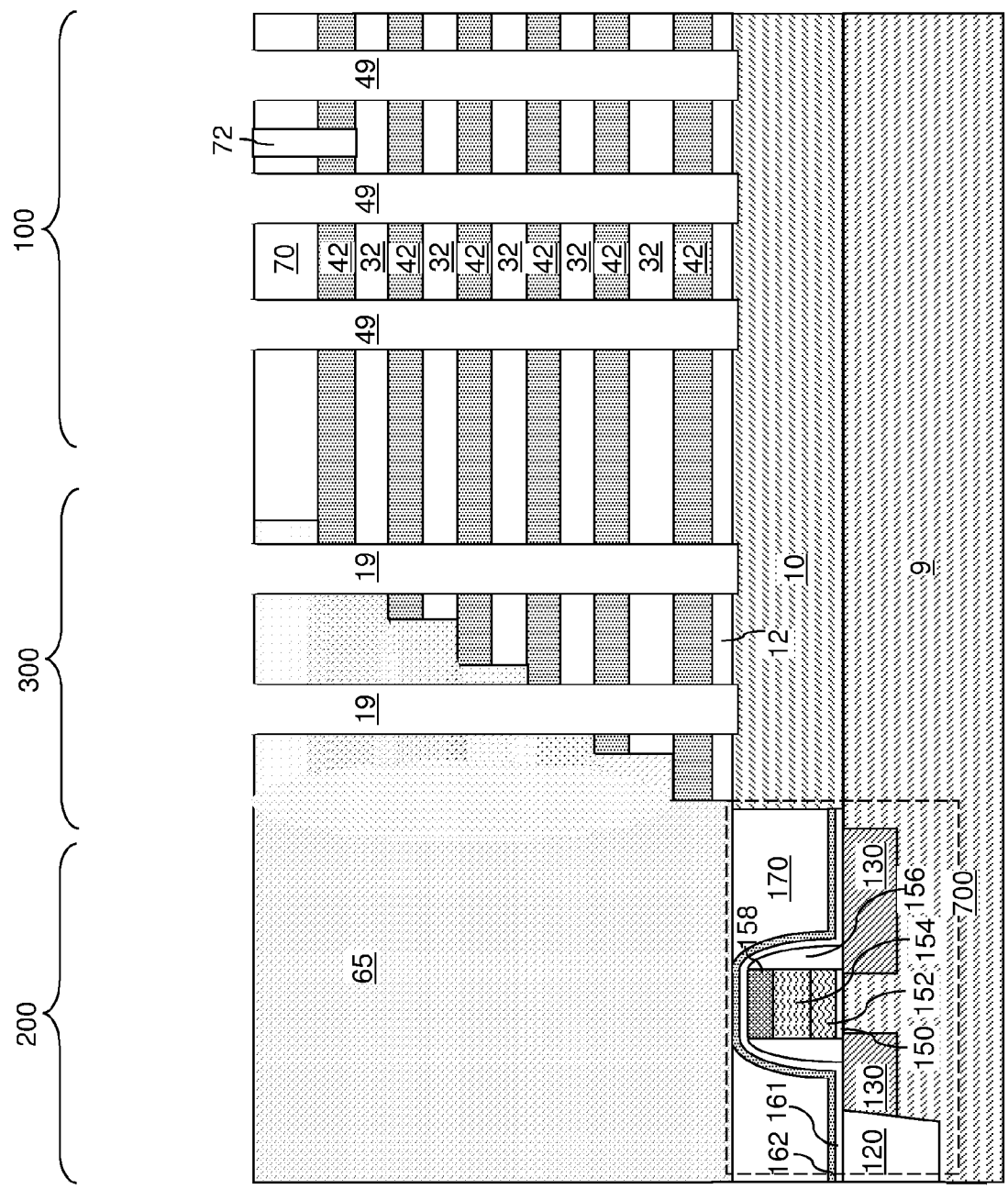
FIG. 4A is a schematic vertical cross-sectional view of the first exemplary structure after formation of memory openings and support openings according to the first embodiment of the present disclosure.
Figure 4B:
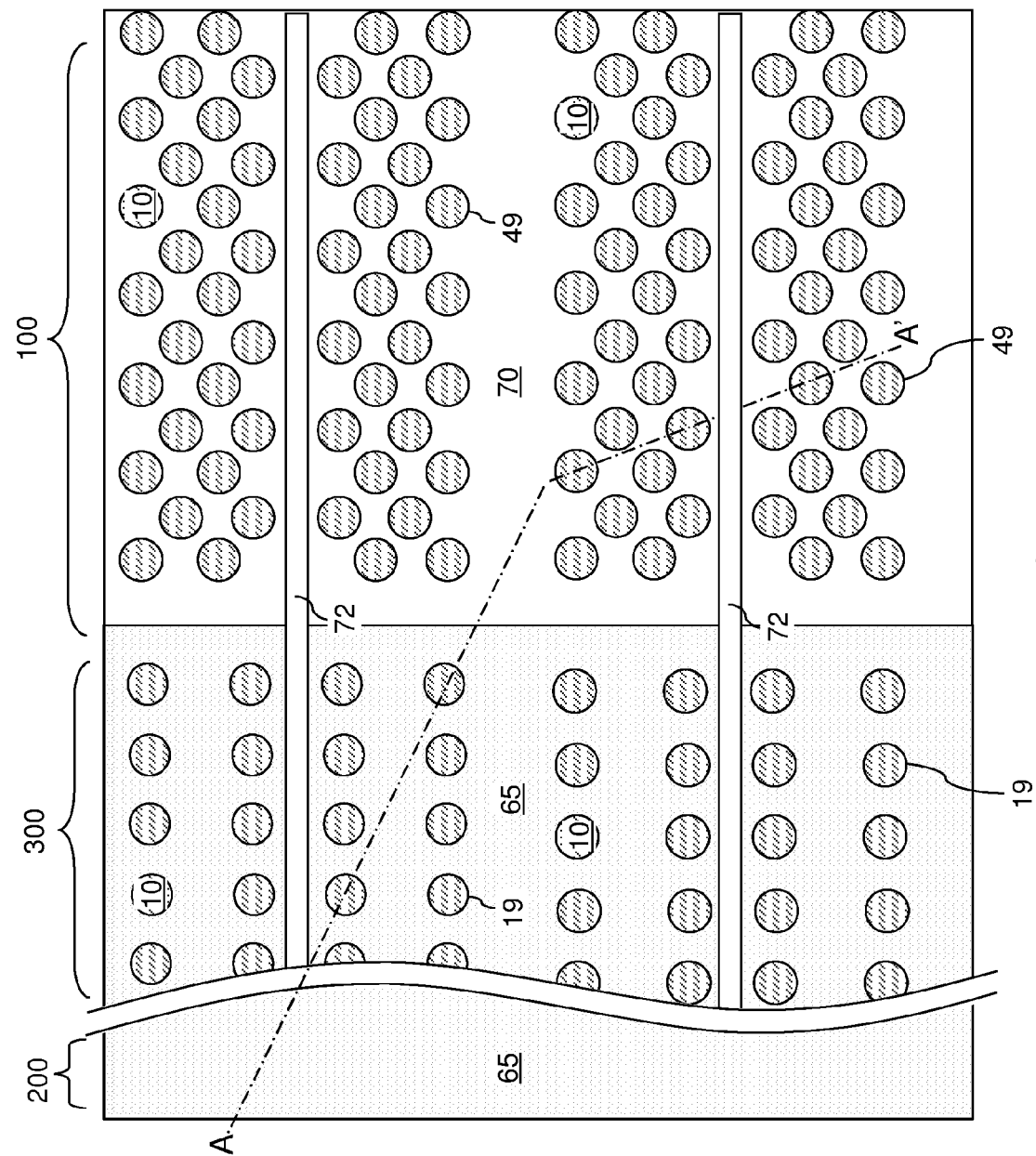
FIG. 4B is a top-down view of the first exemplary structure of FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5E illustrate structural changes in a memory opening 49 during formation of an epitaxial channel portion 11 and a memory film therein. The same structural change occurs simultaneously in each of the other memory openings 49 and in each support opening 19 in FIGS. 4A and 4B.

Referring to FIG. 5A, a memory opening 49 in the exemplary device structure of FIG. 4 is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49 by selective epitaxy. Concurrently with formation of the epitaxial channel portions 11 in the memory openings 11, epitaxial pedestals having the same structure as the epitaxial channel portions 11 can be formed at the bottom of each support opening 19. Each epitaxial channel portion 11 comprises a single crystalline semiconductor material in epitaxial alignment with the single crystalline semiconductor material of the semiconductor material layer 10. Likewise, each epitaxial pedestal can be in epitaxial alignment of the single crystalline semiconductor material of the semiconductor material layer 10.

In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49 and in the support openings 19.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is present in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel layer 601, the tunneling dielectric layer 56, the charge storage layer 54, and the blocking dielectric layer 52 within each memory opening 49. Optionally, the physically exposed semiconductor surface at the bottom of each memory cavity 49' can be vertically recessed so that the recessed semiconductor surface underneath the memory cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the charge storage layer 54. Within each memory opening 49, a set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. Within each support opening 19, a set of a blocking dielectric layer 52, a charge storage layer 54, and a tunneling dielectric layer 56 in a memory opening 49 constitutes a dielectric layer stack, which has the same composition and thickness as the memory film 50. In one embodiment, the first semiconductor channel layer 601, the tunneling dielectric layer 56, the charge storage layer 54, and the blocking dielectric layer 52 can have vertically coincident sidewalls.

Figure 5E:
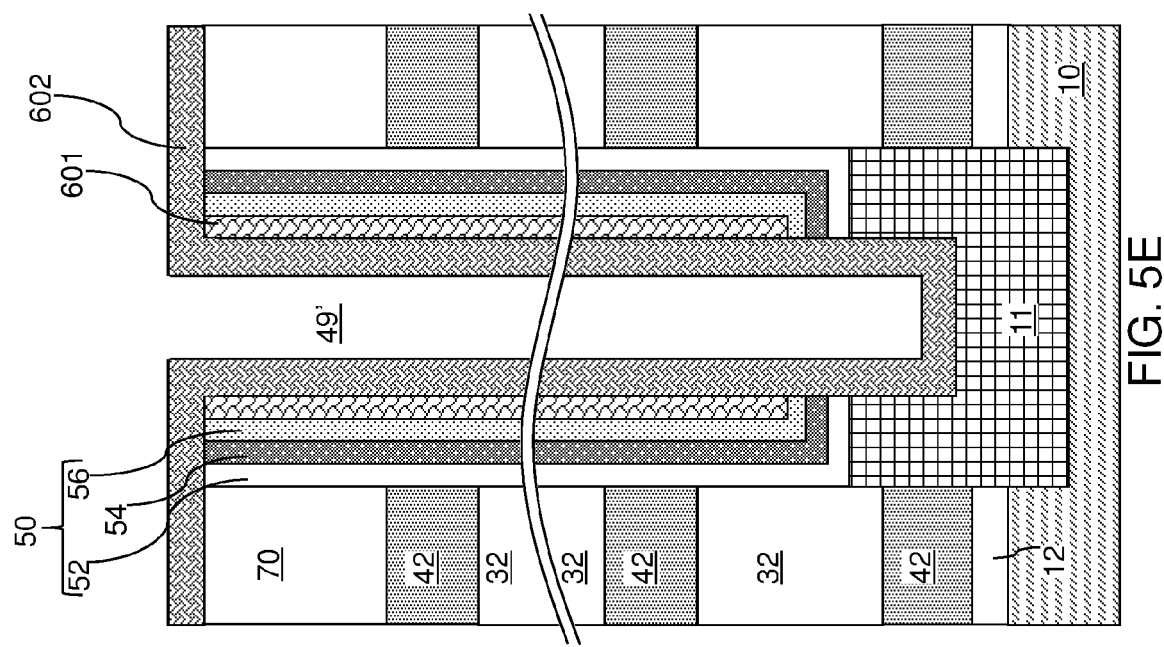

Referring to FIG. 5E, a second semiconductor channel layer 602 can be deposited directly on the semiconductor surface of the epitaxial channel portion 11 or the semiconductor substrate layer 10 if portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602. The structure illustrated in FIG. 5E can be formed within each memory opening 49 and within each support opening 19. The structure corresponding to the epitaxial channel portion 11 within each support opening is herein referred to as an epitaxial pedestal 11', instances of which are illustrated in FIG. 6A.

Figure 6A:
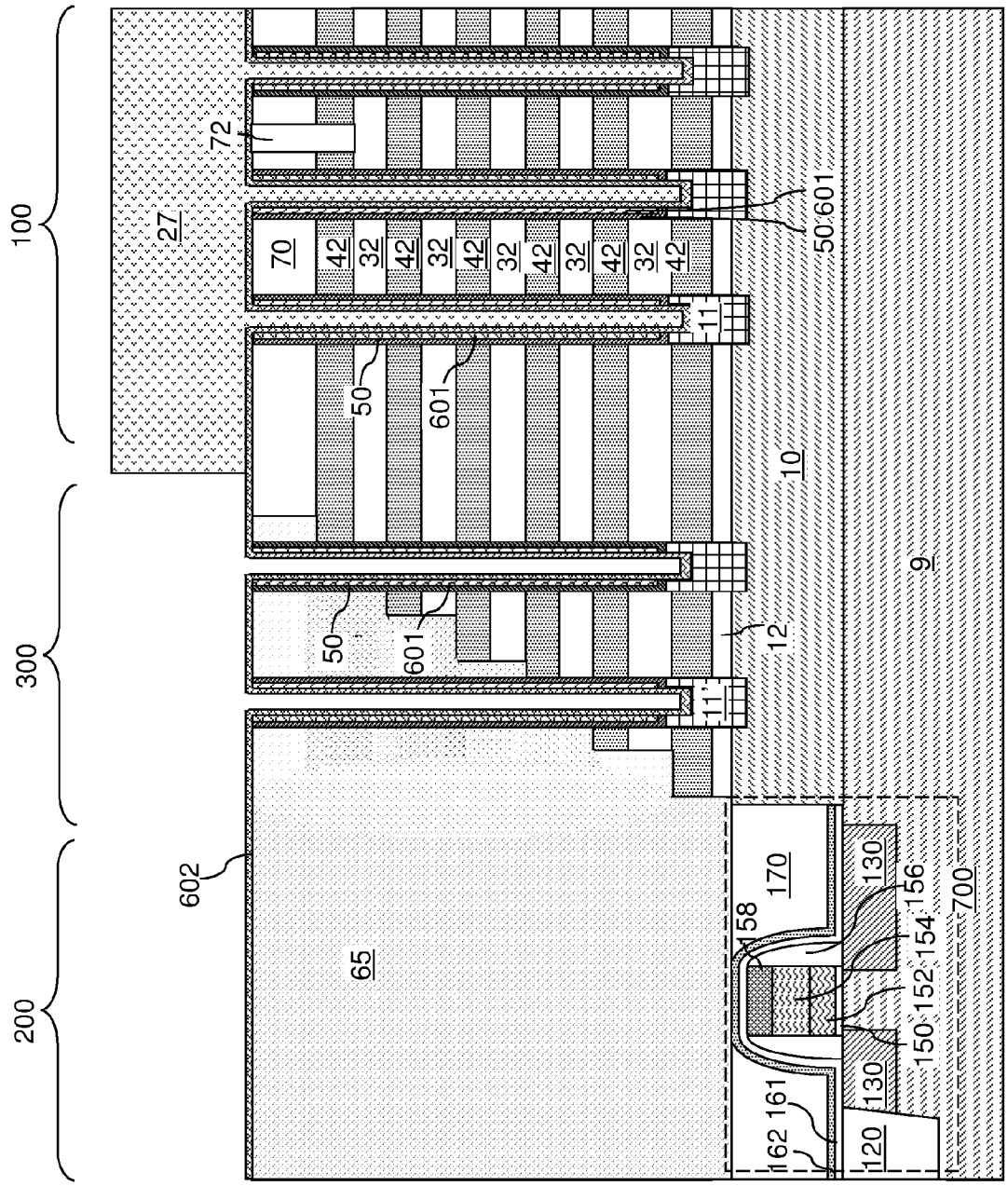
FIG. 6A is a schematic vertical cross-sectional view of the first exemplary structure after the processing steps of FIG. 5E according to the first embodiment of the present disclosure.
Figure 6B:
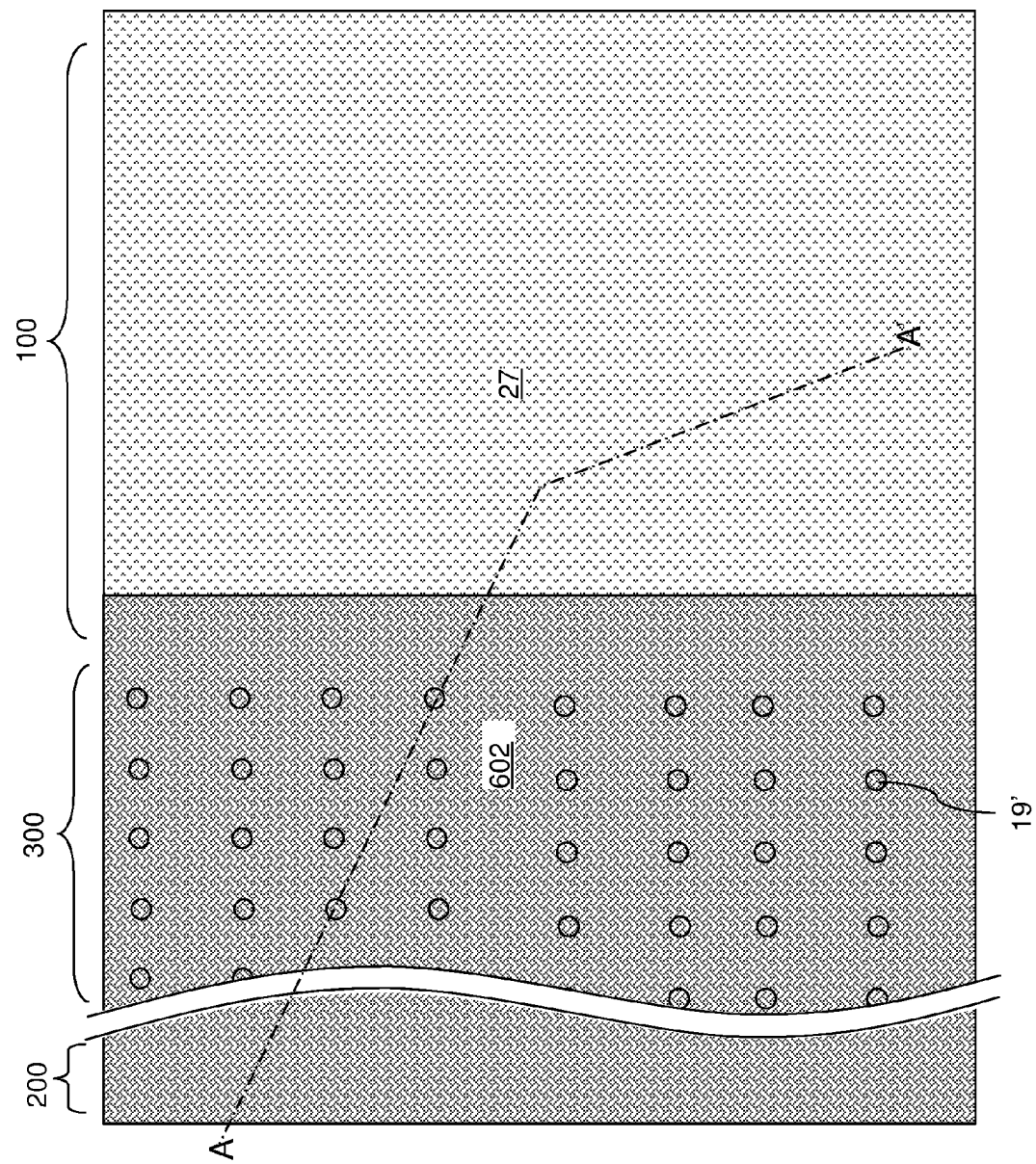
FIG. 6B is a top-down view of the first exemplary structure of FIG. 6A. The vertical plane A-A' is the plane of the cross-section for FIG. 6A.

Referring to FIGS. 6A and 6B, a photoresist layer 27 can be applied over the second semiconductor channel layer 602, and can be lithographically patterned to cover the portion of the first exemplary structure in the memory array region 100, while not covering the portion of the first exemplary structure in the contact region 300 and the peripheral device region 200.

Figure 7:
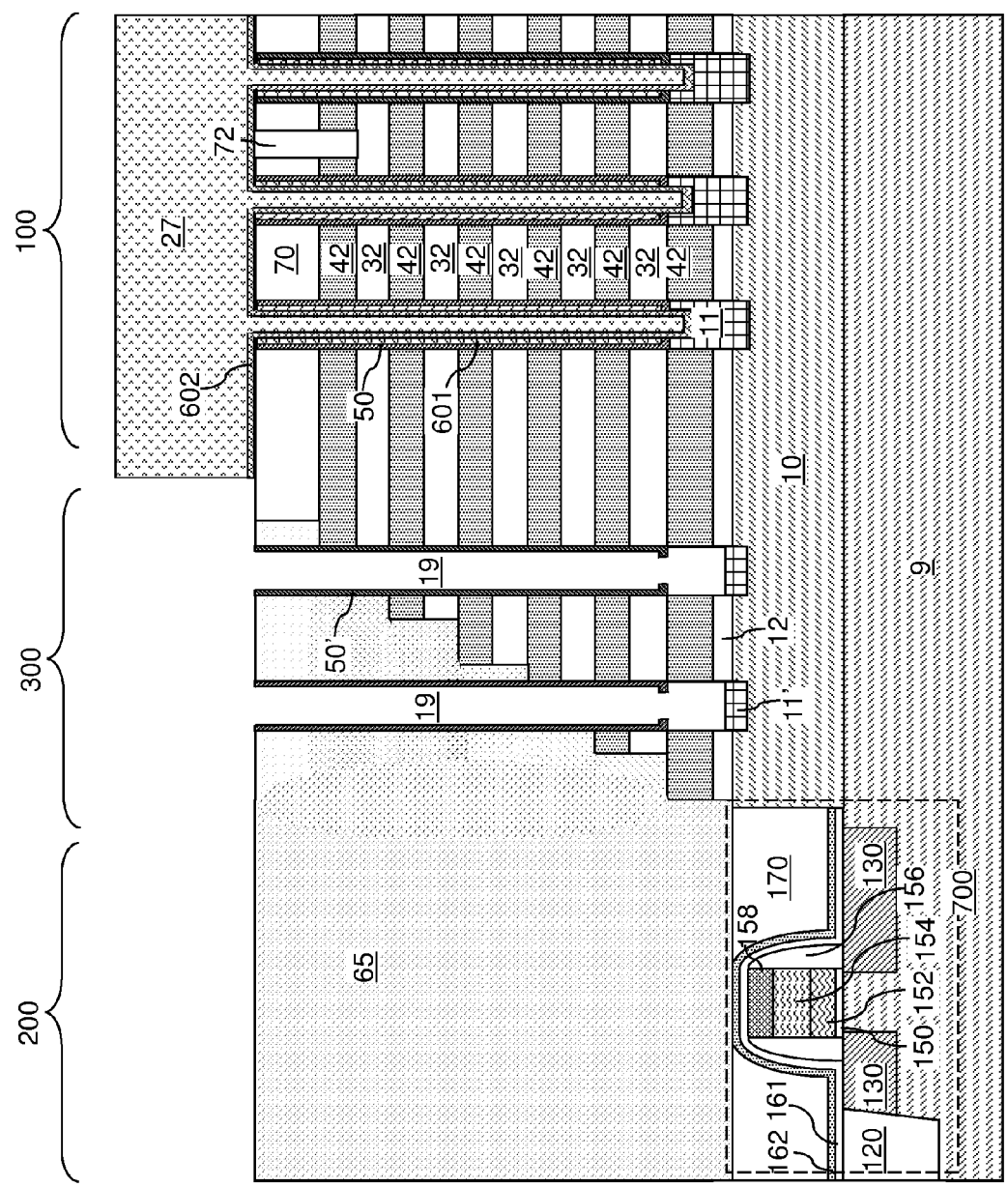
FIG. 7 is a schematic vertical cross-sectional view of the first exemplary structure after removal of semiconductor channel layers from inside the support openings according to the first embodiment of the present disclosure.

Referring to FIG. 7, the portions of the first second semiconductor channel layers (601, 602) that are not covered by the photoresist layer 27 can be removed by an etch process. The etch process can be selective to the dielectric materials of the memory films 50 and the dielectric layer stacks 50'. In one embodiment, the etch process can be an etch process that etches the semiconductor materials of the first and second semiconductor channel layers (601, 602) and the epitaxial pedestals 11' without etching the dielectric materials of the dielectric layer stacks 50' (which have the same composition as the memory films 50). The etch process can include an isotropic wet etch process employing a trimethyl-2 hydroxyethyl ammonium hydroxide (TMY) solution or an anisotrpopic dry etch process that employs HCl or another suitable etching gas. The portions of the first second semiconductor channel layers (601, 602) in the contact region 300 and the peripheral device region 200 and an upper portion of each epitaxial pedestal 11' can be removed by the etch process. If desired, a dilute hydrofluoric acid (DHF) clean may be performed to remove any oxidized materials of the first and second semiconductor channel layers (601, 602) before the etching step. If desired, a distilled water and isopropyl alcohol (IPA) rinse may be performed after the etching step. The photoresist layer 27 can be subsequently removed, for example, by ashing. At least a portion of each epitaxial pedestal 11' (or the entire epitaxial pedestal 11') can be removed from inside the support openings 19 while the epitaxial channel portions 11 are not removed from the memory openings 49. Removal of the portions of the epitaxial pedestals 11' and portions of the first and second semiconductor material layers (601, 602) within the support openings 19 can be performed by a same etch process. While the present disclosure is described employing an embodiment in which a first semiconductor channel layer 601 is employed, embodiments are expressly contemplated herein in which the first semiconductor channel layer 601 is omitted.

FIG. 8A shows a portion of the first exemplary structure within a support opening 19 after the processing steps of FIG. 7, and FIG. 8B shows a portion of the first exemplary structure within a memory opening 49 after the processing steps of FIG. 7. Each memory opening 49 includes an instance of an epitaxial channel portion 11, an instance of a memory film 50, an instance of a first semiconductor channel layer 601, and a respective portion of the second semiconductor channel layer 602. A memory cavity 49' is present within each memory opening 49. Each support opening 19 can include an instance of an optional epitaxial pedestal 11', which has a lesser height than an epitaxial channel portion 11. Further, each support opening 19 can include an instance of a dielectric layer stack 50', which can be vertically spaced from the underlying epitaxial pedestal 11'. The top surface of the epitaxial pedestal 11' can be located at the level of the gate dielectric layer 12 or below the horizontal plane including an interface between the semiconductor substrate (9, 10) and the gate dielectric layer 12.

Additional material portions can be subsequently deposited in the memory openings 49 and the support openings 19 to form memory stack structures and support pillar structures in the memory openings 49 and the support openings 19, respectively. For example, a dielectric material can be deposited to form a dielectric core in each memory opening 49 and a dielectric fill material portion in each support opening 19.

Referring to FIGS. 9A and 9B, a dielectric core layer 62L can be deposited in each of the memory cavities 49' and the support cavities 19'. FIG. 9A shows a portion of the first exemplary structure within a support opening 19 after deposition of the dielectric core layer 62L, and FIG. 9B shows a portion of the first exemplary structure within a memory opening 49 after deposition of the dielectric core layer 62L. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIGS. 10A and 10B, horizontal portions of the dielectric core layer 62L and the second semiconductor channel layer 602 located above the horizontal plane including the top surface of the insulating cap layer 70 can be removed by a planarization process, which can include chemical mechanical planarization and/or a recess etch. Subsequently, the dielectric material of the dielectric core layer 62L can be vertically recessed for example, by a recess etch. FIG. 10A shows a portion of the first exemplary structure within a support opening 19 after recessing of the dielectric core layer 62L, and FIG. 10B shows a portion of the first exemplary structure within a memory opening 49 after recessing of the dielectric core layer 62L. The recess etch can be selective to the memory films 50, the dielectric layer stack 50', the insulating cap layer 70, and optionally to the semiconductor materials of the first and second semiconductor material layers (601, 602). Each remaining portion of the dielectric core layer 62L in a memory opening 49 is herein referred to as a dielectric core 62. Each remaining portion of the dielectric core layer 62L in a support opening 19 is herein referred to as a dielectric fill material portion 62'. The top surfaces of the dielectric cores 62 and the dielectric fill material portions 62' can be located between a horizontal plane including the top surface of the insulating cap layer 70 and a horizontal plane including the bottom surface of the insulating cap layer 70.

Referring to FIGS. 11A and 11B, drain regions 63 can be formed by depositing a doped semiconductor material within each recessed region above the dielectric cores 62, and dummy drain regions 63' can be formed by depositing the doped semiconductor material within each recessed region above the dielectric fill material portions 62'. FIG. 11A shows a portion of the first exemplary structure within a support opening 19 after formation of the dummy drain regions 63, and FIG. 11B shows a portion of the first exemplary structure within a memory opening 49 after formation of the drain regions 63. Specifically, a doped semiconductor material can be simultaneously deposited above the dielectric cores 62 to form the drain regions 63 and above the dielectric fill material portions 62' to form the dummy drain regions 63'. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63 and the dummy drain regions 63'. Bit lines will be electrically connected to the drain regions 63 as will be described below. In contrast, the dummy drain regions 63' will not be electrically connected to bit lines or to any other electrodes.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of an epitaxial pedestal 11' (if present), a dielectric layer stack 50', a dielectric fill material portion 62', and a dummy drain region 63' within each support opening 19 fills the respective support openings 19, and constitutes a support pillar structure 20.

Figure 12:
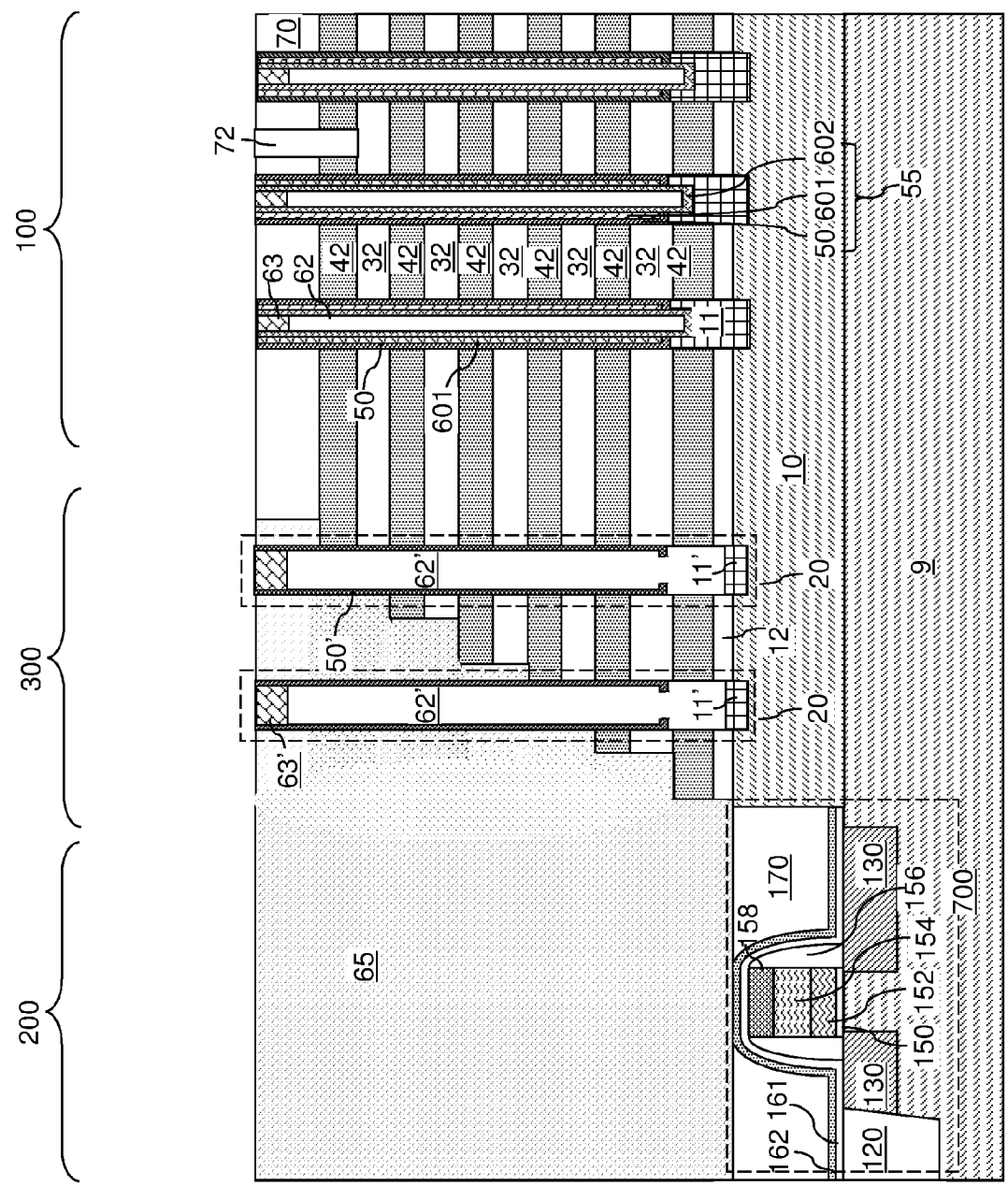
FIG. 12 is a schematic vertical cross-sectional view of the first exemplary structure after formation of drain select level isolation structures according to the first embodiment of the present disclosure.

Referring to FIG. 12, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each exemplary memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 13A:
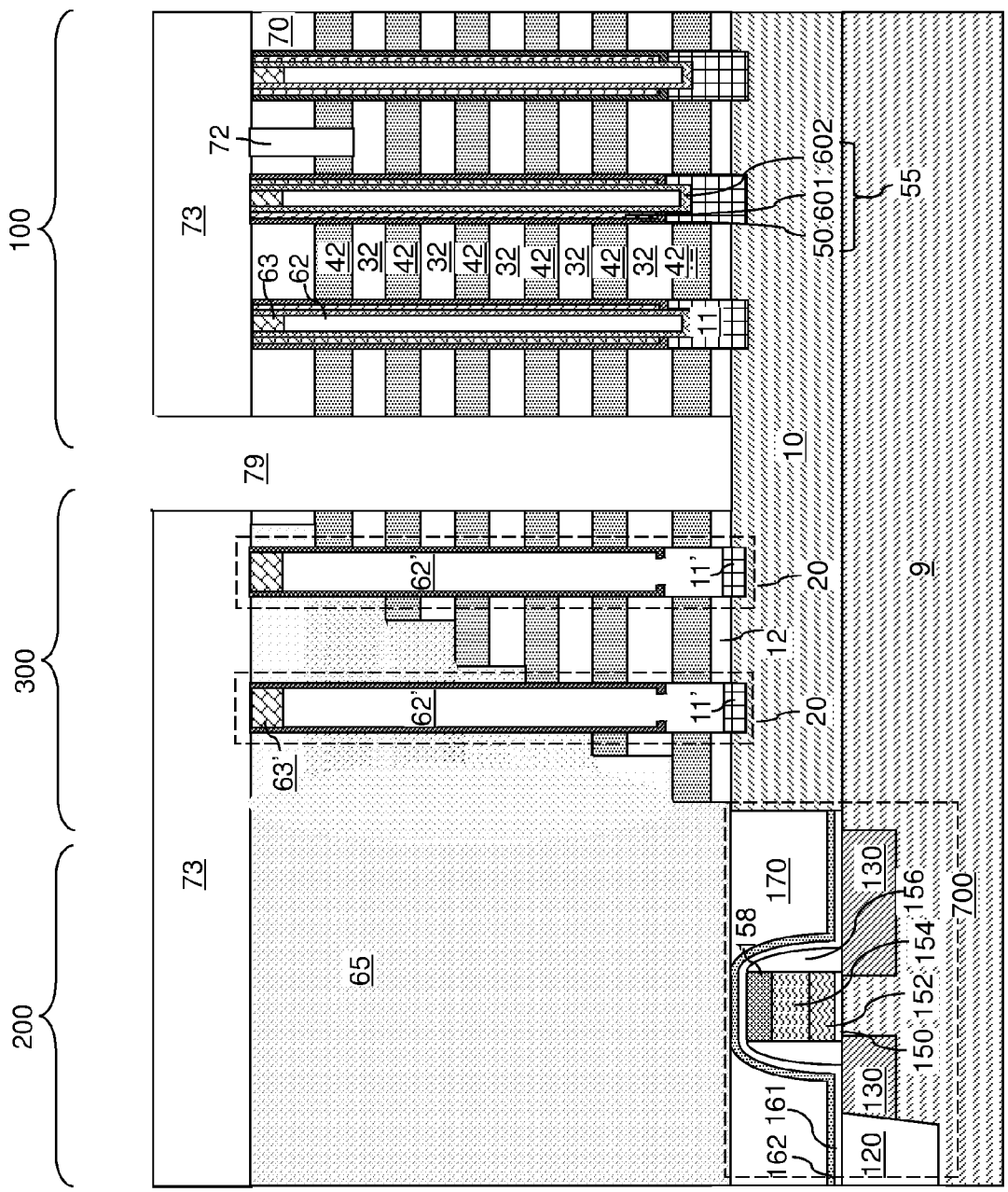
FIG. 13A is a schematic vertical cross-sectional view of the first exemplary structure after formation of a backside trench according to the first embodiment of the present disclosure.
Figure 13B:
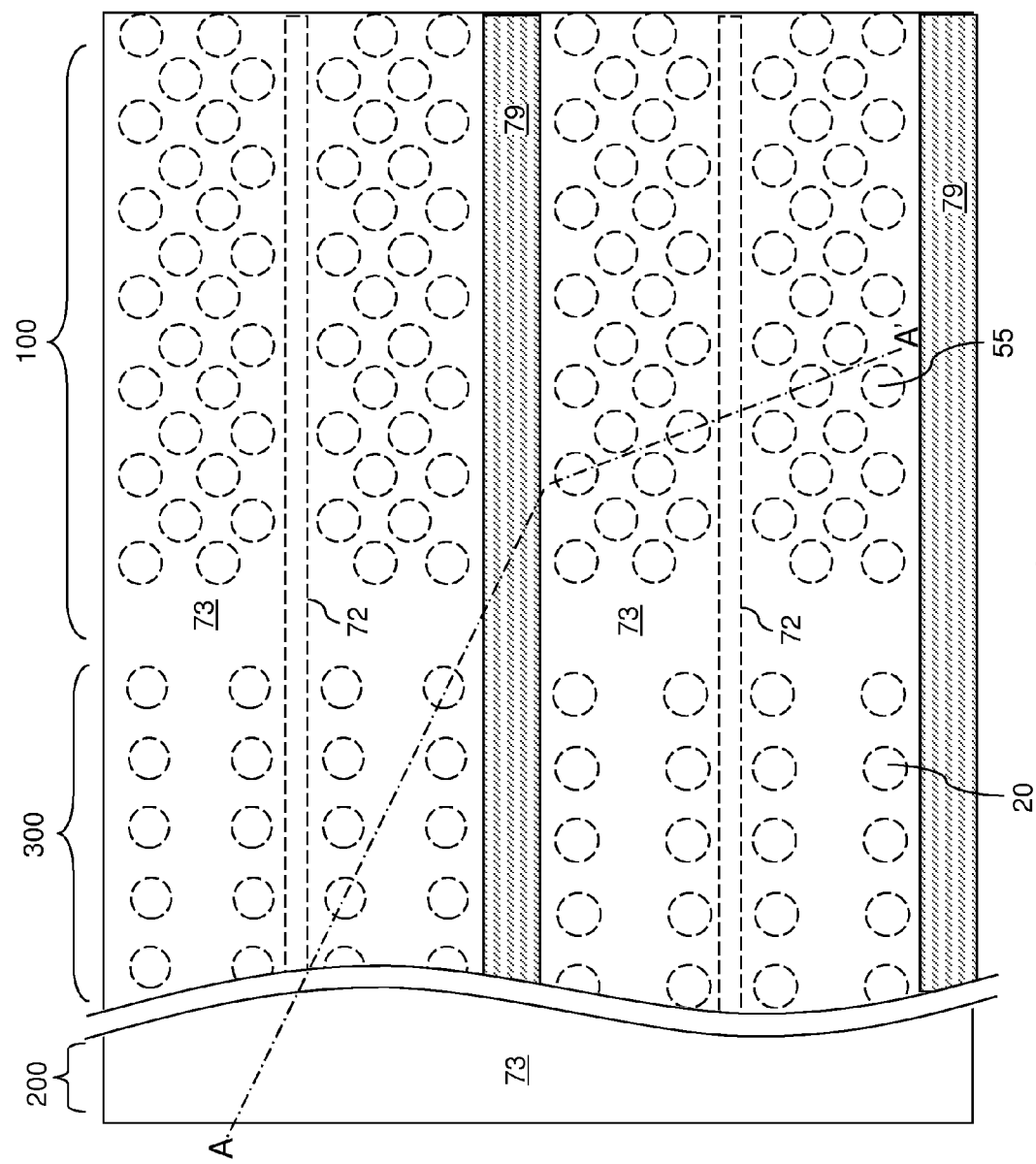
FIG. 13B is a partial see-through top-down view of the first exemplary structure of FIG. 13A. The vertical plane A-A' is the plane of the schematic vertical cross-sectional view of FIG. 13A.

Referring to FIGS. 13A and 13B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the alternating stack (32, 42), and is lithographically patterned to form openings in areas between clusters of memory stack structures 55. The pattern in the photoresist layer can be transferred through the alternating stack (32, 42) and/or the retro-stepped dielectric material portion 65 employing an anisotropic etch to form the backside trenches 79, which vertically extend at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 14:
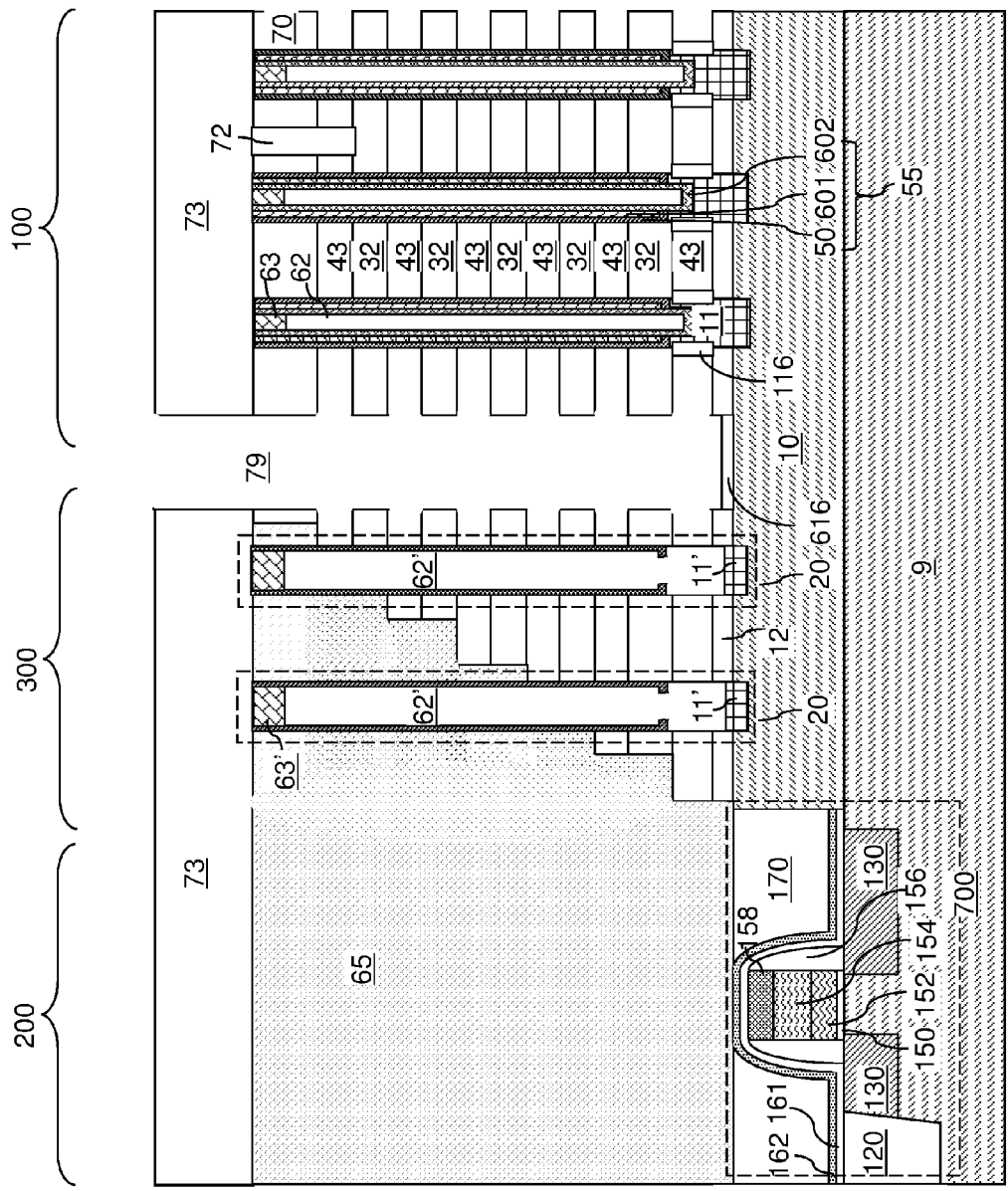
FIG. 14 is a schematic vertical cross-sectional view of the first exemplary structure after formation of backside recesses according to the first embodiment of the present disclosure.

Referring to FIGS. 14 and 15A, an etchant that selectively etches the second material of the sacrificial material layers 42 with respect to the first material of the insulating layers 32 can be introduced into the backside trenches 79, for example, employing an etch process. FIG. 15A illustrates a region of the first exemplary structure of FIG. 14. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50 and the dielectric layer stacks 50'. In one embodiment, the sacrificial material layers 42 can include silicon nitride, and the materials of the insulating layers 32, the support pillar structure 20, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32 and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor material layer 10.

The etch process that removes the second material selective to the first material and the outermost layer of the memory films 50 and the dielectric layer stacks 50' can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 15B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

Referring to FIG. 15C, a metallic barrier layer 46A can be deposited in the backside recesses. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 16:
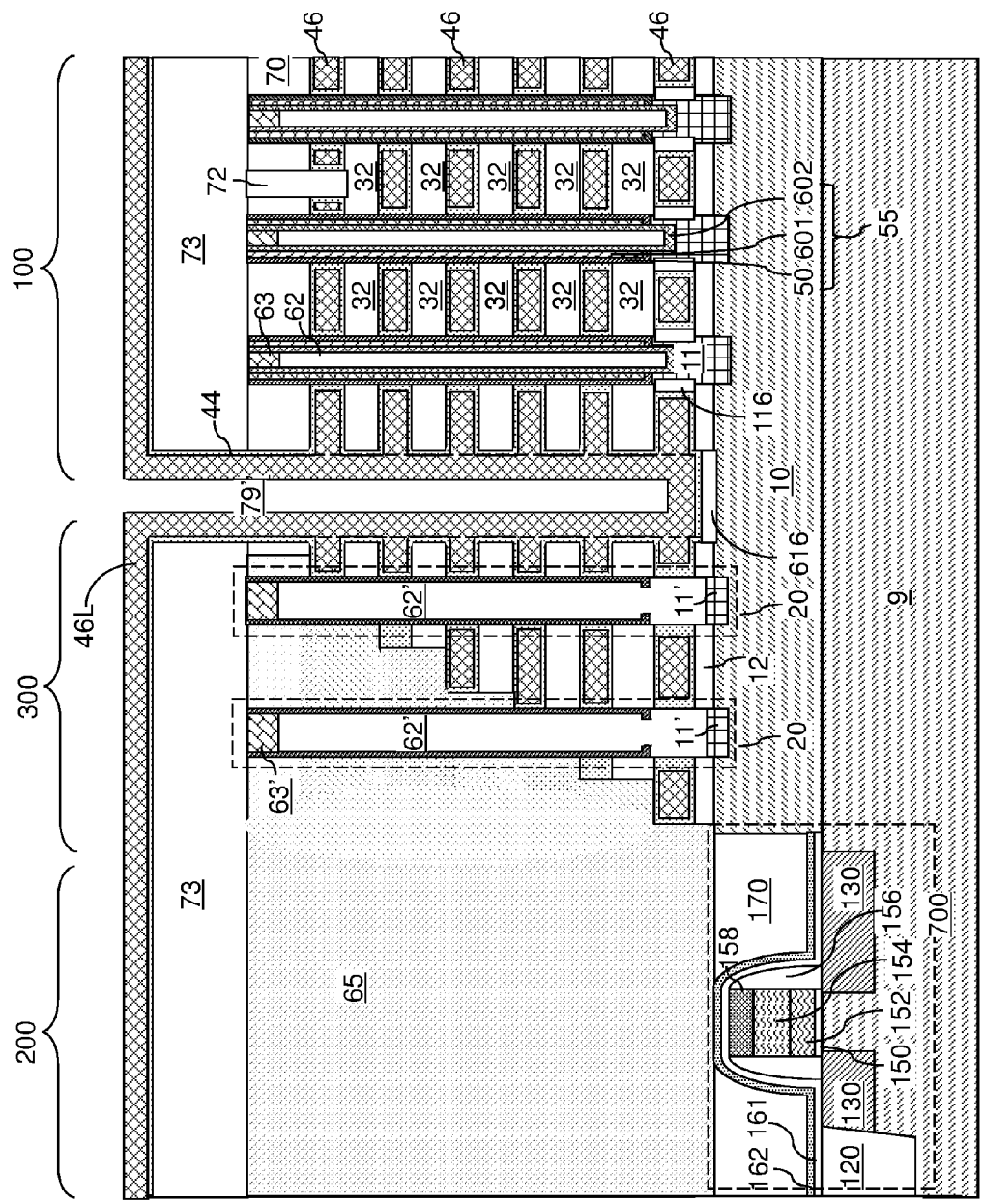
FIG. 16 is a schematic vertical cross-sectional view of the first exemplary structure at the processing step of FIG. 15D.

Referring to FIGS. 15D and 16, a metal fill material is deposited in the plurality of backside recesses 43, on the sidewalls of the at least one the backside contact trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metal fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside contact trench 79 and over the contact level dielectric layer 73. Each electrically conductive layer 46 includes a portion of the metallic barrier layer 46A and a portion of the metal fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metal fill material layer 46B that are located in the backside trenches 79 or above the contact level dielectric layer 73.

Each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 17:
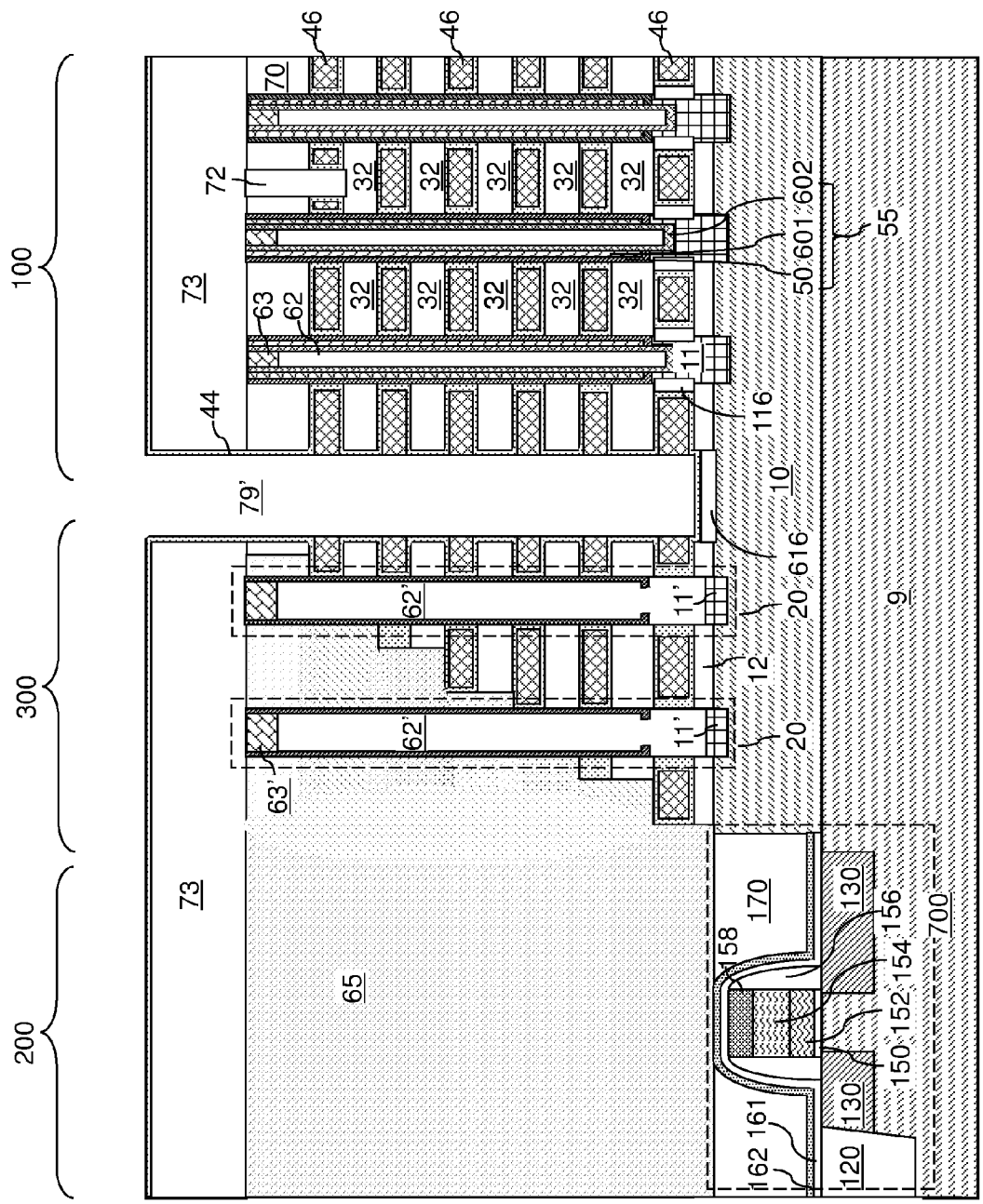
FIG. 17 is a schematic vertical cross-sectional view of the first exemplary structure after removal of a deposited conductive material from within the backside trench according to the first embodiment of the present disclosure.

Referring to FIG. 17, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The gate dielectric layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside contact trench 79 depending on whether the gate dielectric layer 12 is not removed or partially removed during removal of the continuous electrically conductive material layer 46L. In one embodiment, a top surface of the cap gate dielectric layer 126 can be physically exposed at the bottom of the backside contact trench 79 after removal of the continuous electrically conductive material layer 46L. A backside cavity 79' is present within each backside contact trench 79.

Figure 18A:
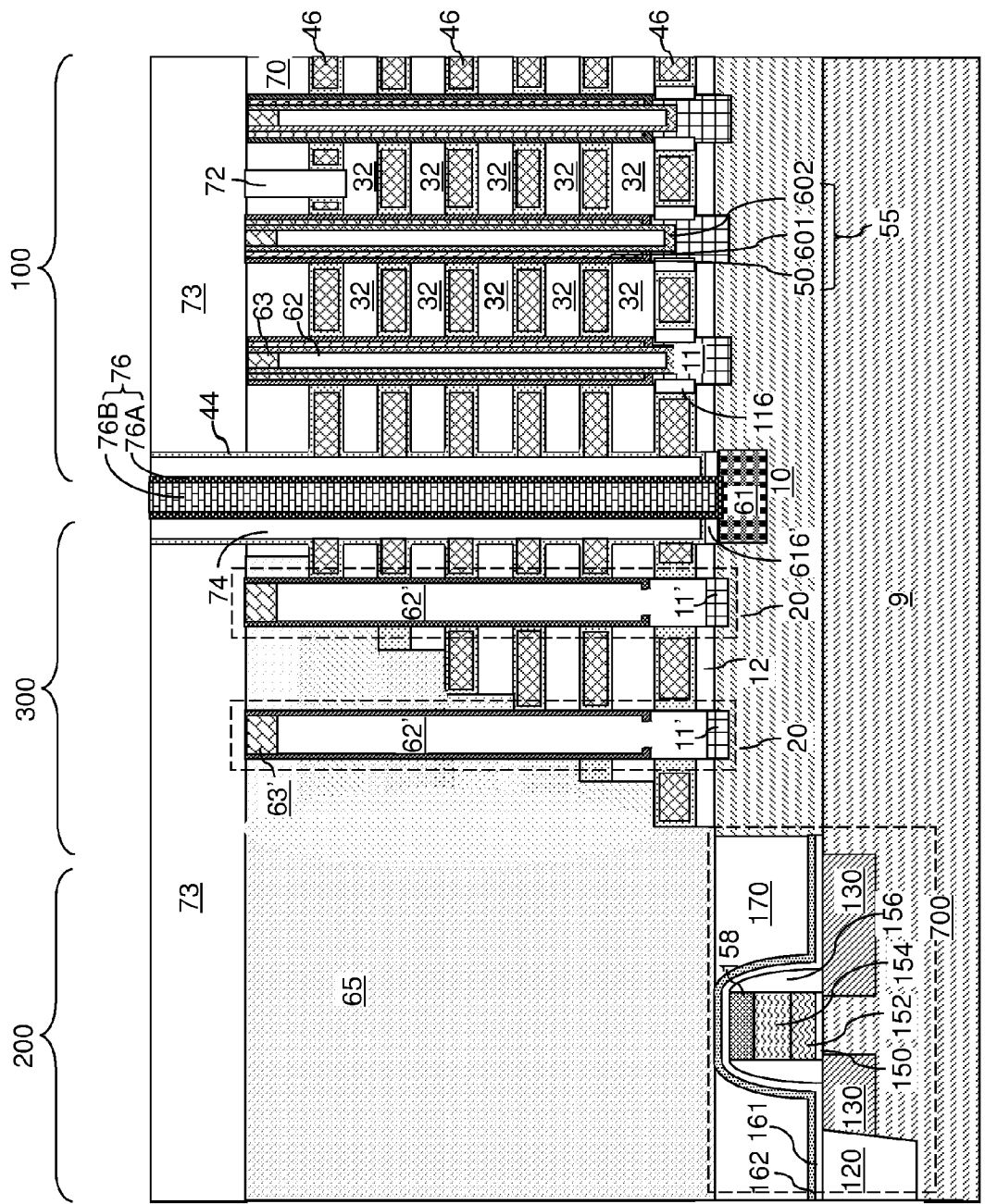
FIG. 18A is a schematic vertical cross-sectional view of the first exemplary structure after formation of an insulating spacer and a backside contact structure according to the first embodiment of the present disclosure.

Referring to FIGS. 18A and 18B, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. An opening is formed though the planar dielectric portion 616 underneath each backside cavity 79', thereby vertically extending the backside cavity 79'. A top surface of the semiconductor material layer 10 can be physically exposed at the bottom of each backside contact trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76.

The backside contact via structure 76 extends through the alternating stack (32 46), and contacts a top surface of the source region 61. If a backside blocking dielectric layer 44 is employed, the backside contact via structure 76 can contact a sidewall of the backside blocking dielectric layer 44.

Figure 19A:
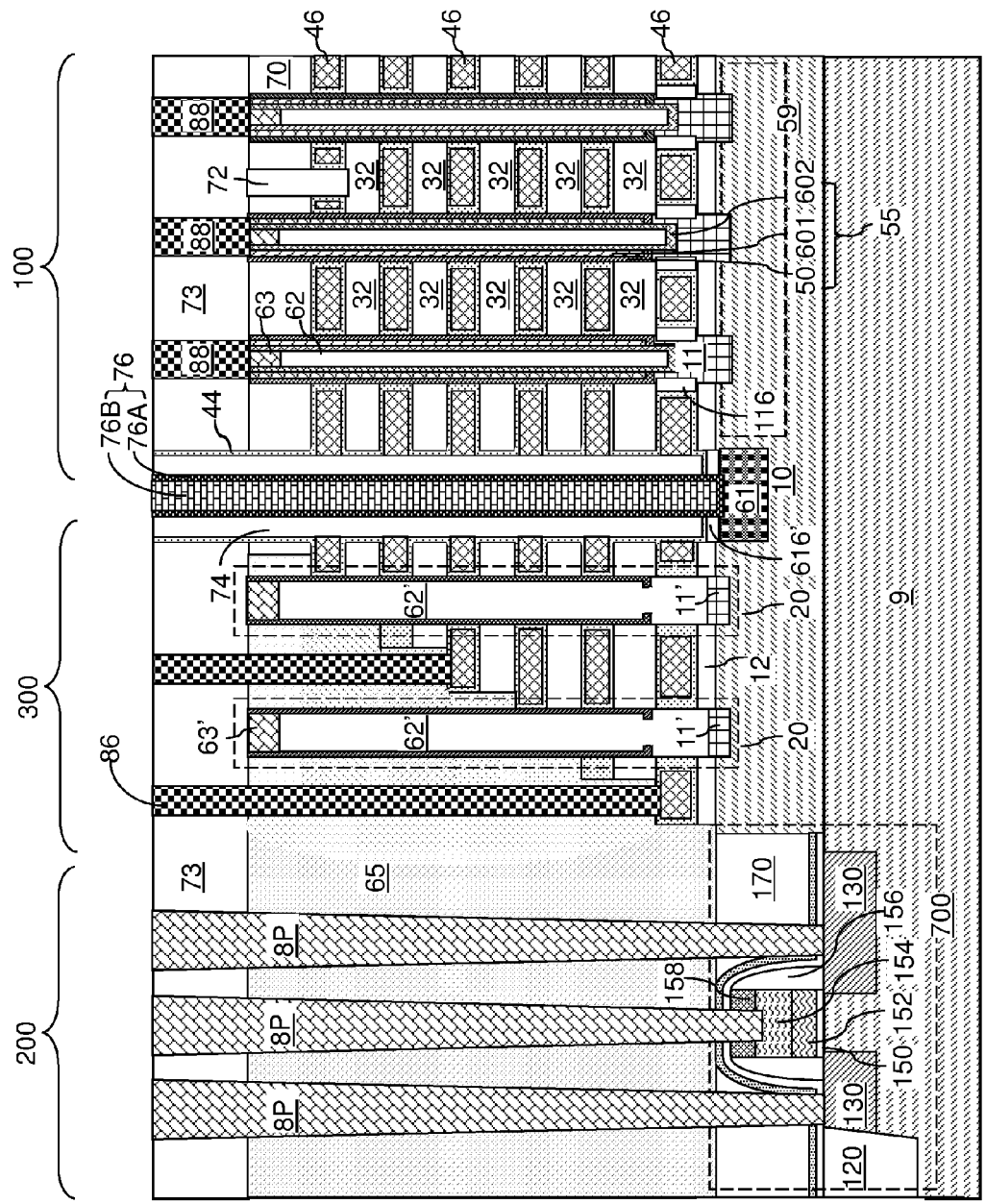
FIG. 19A is a schematic vertical cross-sectional view of the first exemplary structure after formation of additional contact via structures according to the first embodiment of the present disclosure.
Figure 19B:
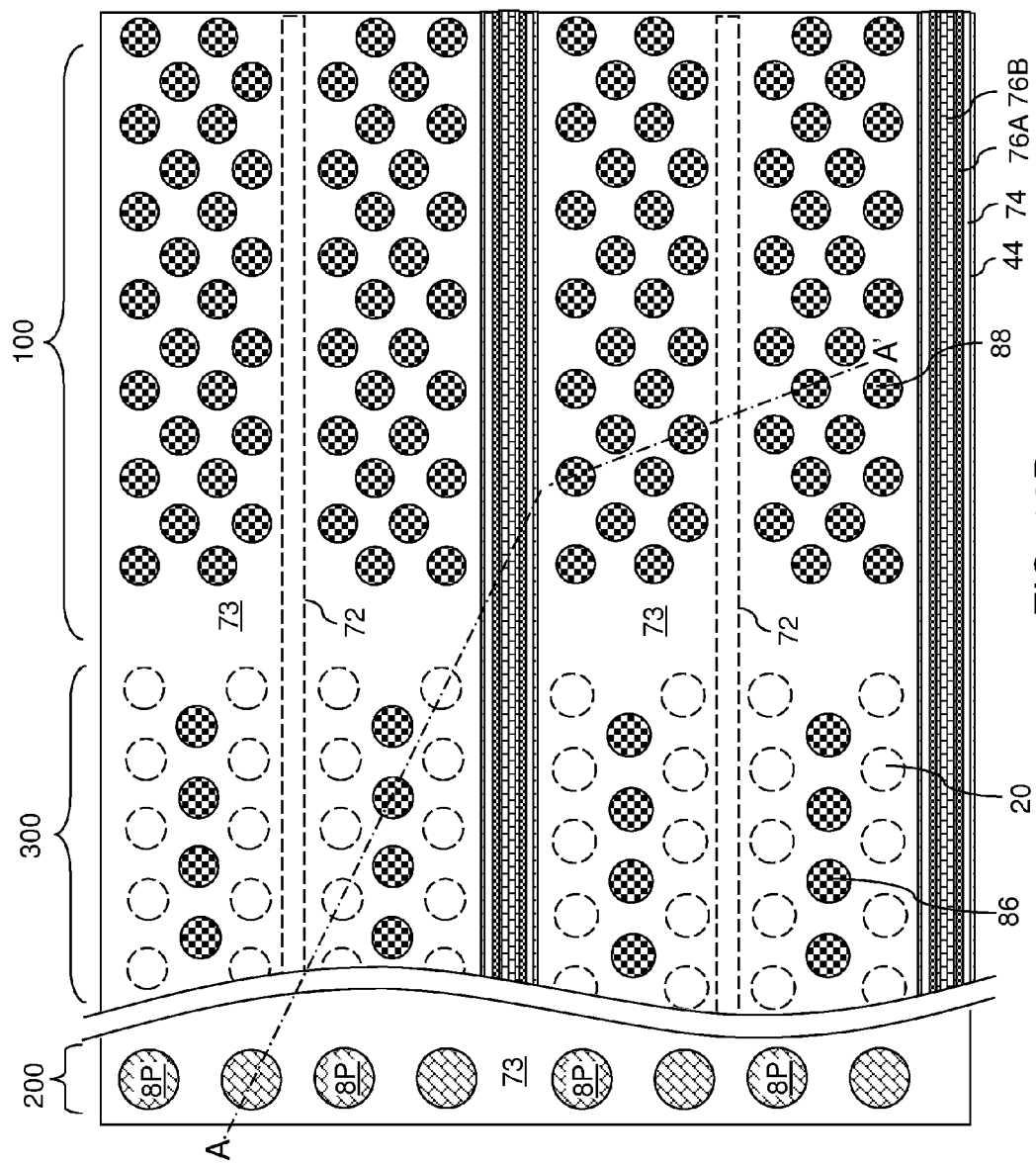
FIG. 19B is a top-down view of the first exemplary structure of FIG. 19A. The vertical plane A-A' is the plane of the schematic vertical cross-sectional view of FIG. 19A.

Referring to FIGS. 19A and 19B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63 (but not on the dummy drain regions 63'). Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. Thereafter, bit lines (not shown) are formed in electrical contact with the drain contact via structures 88.

Figure 20:
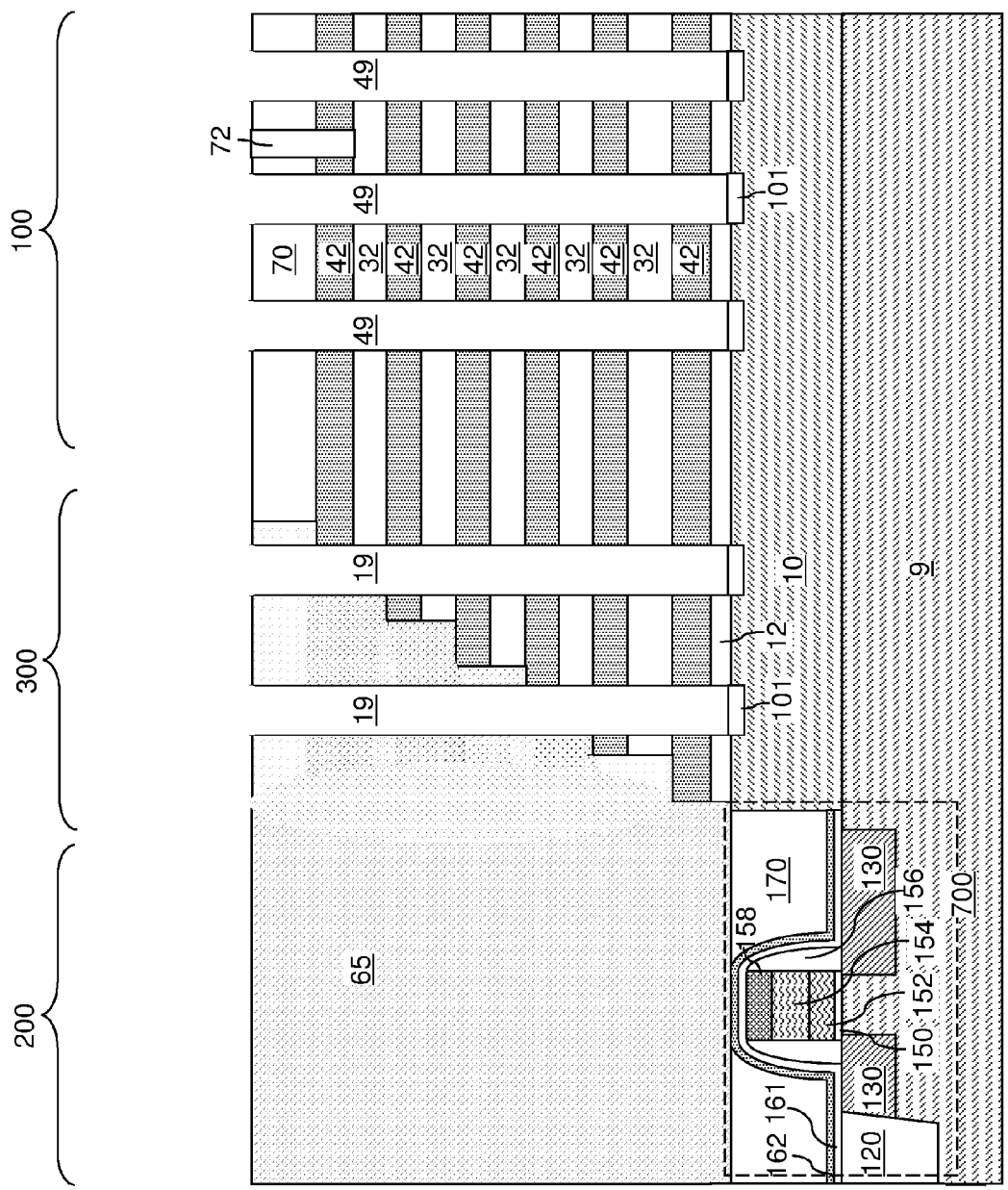
FIG. 20 is a schematic vertical cross-sectional view of a second exemplary structure after formation of semiconductor oxide portions at bottom portions of memory openings and support openings according to a second embodiment of the present disclosure.

Referring to FIG. 20, a second exemplary structure according to a second embodiment of the present disclosure can be derived from the first exemplary structure of FIGS. 4A and 4B by performing an oxidation process to form semiconductor oxide portions 101 at bottom portions of the memory openings 49 and the support openings 19. The oxidation process can be a thermal oxidation process or a plasma oxidation process. Surface portions of the semiconductor material layer 10 underlying the memory openings 49 and the support openings 19 are converted into the semiconductor oxide portions 101, which include a dielectric oxide of the semiconductor material of the semiconductor material layer 10 (e.g., silicon oxide). The thickness of the semiconductor oxide portions 101 can be in a range from 3 nm to 30 nm, although lesser and greater thicknesses can also be employed. A first subset of the semiconductor oxide portions 101 is formed underneath the memory openings 49, and a second subset of the semiconductor oxide portions 101 is formed underneath the support openings 19.

Figure 21:
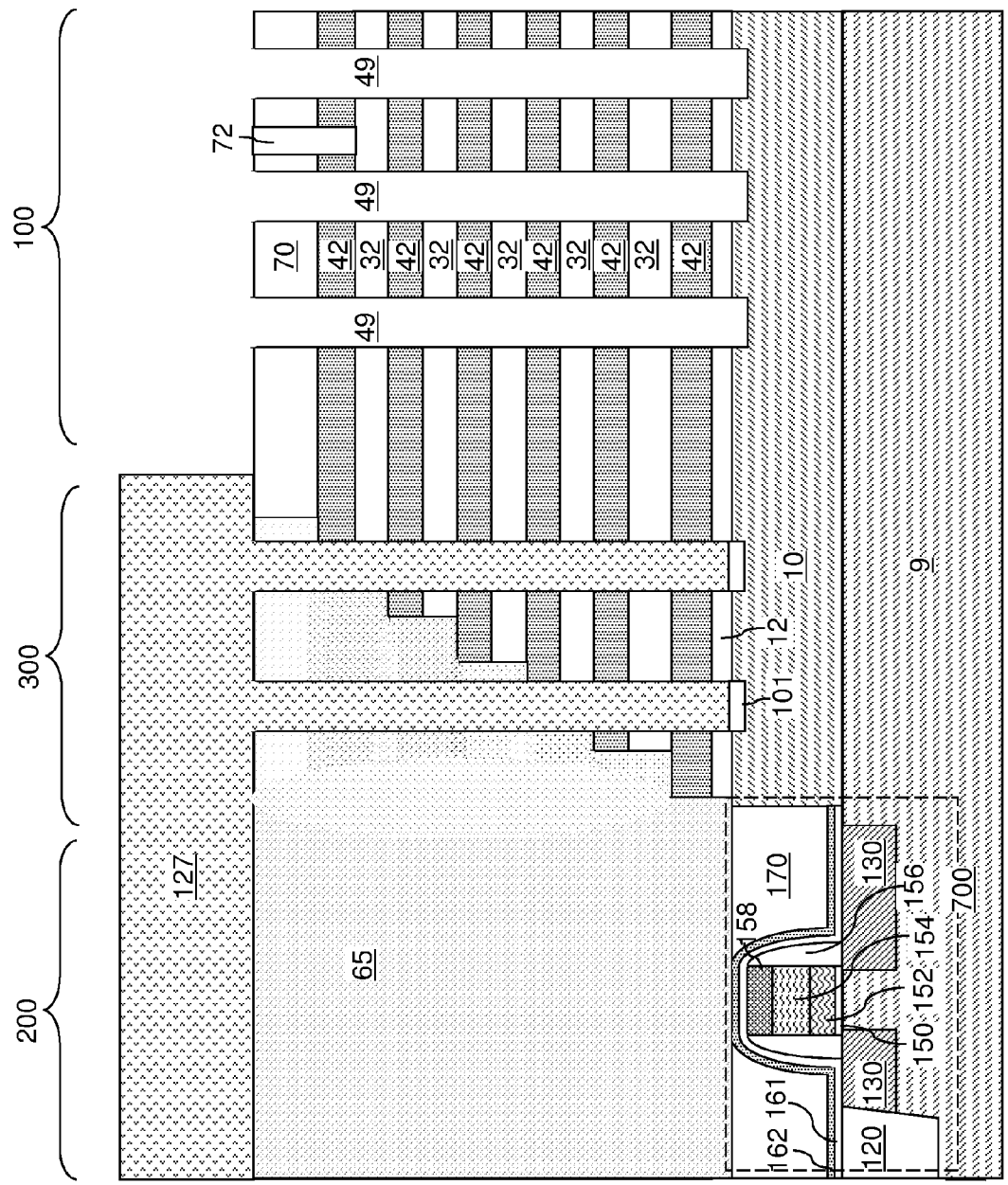
FIG. 21 is a schematic vertical cross-sectional view of the second exemplary structure after removal of a subset of the semiconductor oxide portions from underneath the memory openings according to the second embodiment of the present disclosure.

Referring to FIG. 21, a photoresist layer 127 is applied and lithographically patterned to cover the contact region 300 and the peripheral device region 200, while not covering the memory array region 100. The photoresist layer 127 may fill the support openings 19, and does not fill the memory openings 49. An etch process can be performed to remove the first subset of the semiconductor oxide portions 101 (which are located underneath the memory openings 49 and are not covered by the patterned photoresist layer 127), while the second subset of the semiconductor oxide portions 101 underneath the patterned photoresist layer 127 remain intact. An isotropic etch or an anisotropic etch may be employed to remove the first subset of the semiconductor oxide portions 101. For example, a wet etch employing hydrofluoric acid of a vapor phase etch employing HF vapor may be employed to remove the subset of the first semiconductor oxide portions 101 (that is not covered by the patterned photoresist layer 127). The photoresist layer 127 can be subsequently removed, for example, by ashing.

Figure 22:
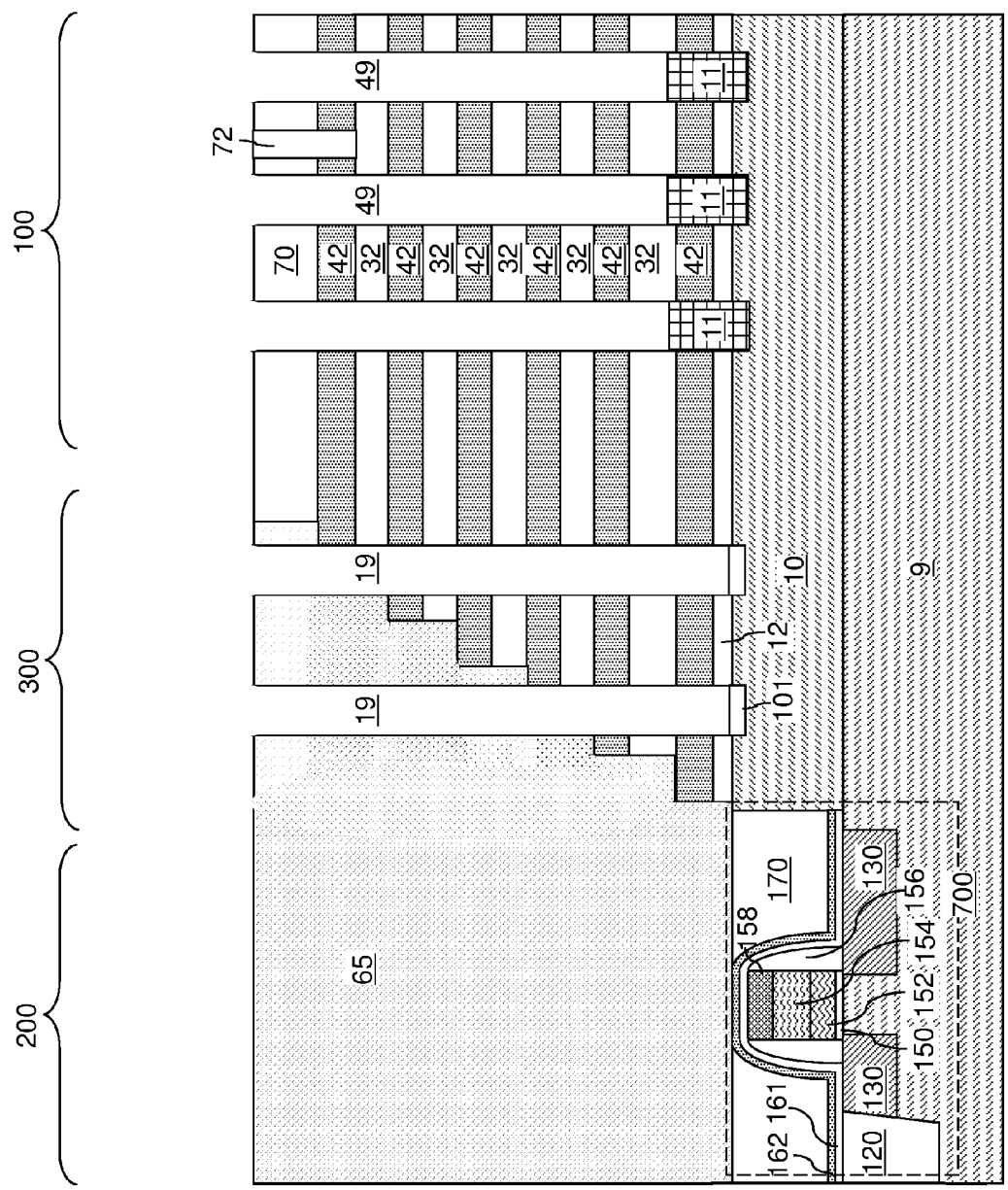
FIG. 22 is a schematic vertical cross-sectional view of the second exemplary structure after formation of epitaxial channel portions in the memory openings by a selective epitaxy process according to the second embodiment of the present disclosure.

Referring to FIG. 22, the processing steps of FIG. 5B can be performed to form epitaxial channel portions 11 on the physically exposed semiconductor surfaces of the semiconductor material layer 10 that underlie the memory openings 49. The epitaxial channel portions 11 are formed at the bottom of each memory opening 49 by a selective epitaxy process, which does not deposit any material on dielectric surfaces. Since the surfaces of the support openings 19 consist of dielectric surfaces (e.g., silicon oxide layer 56 of the dielectric layer stack and semiconductor oxide portions 101), no material is deposited in the support openings 19 at this processing step. Thus, there are no epitaxial channel portions 11 or epitaxial pedestals 11' located in the support openings 19.

Figure 23:
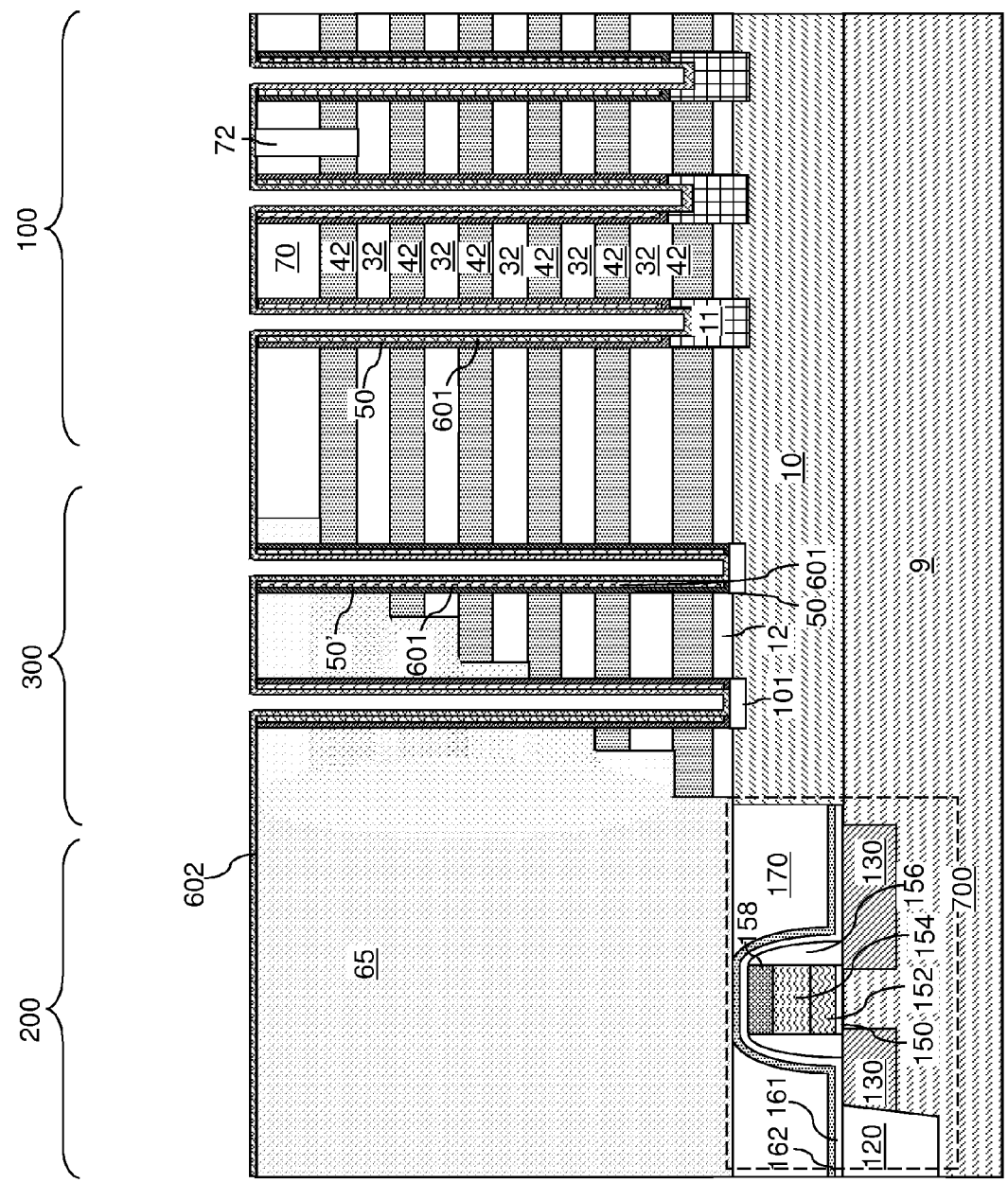
FIG. 23 is a schematic vertical cross-sectional view of the second exemplary structure after formation of a second semiconductor channel layer according to the second embodiment of the present disclosure.

Referring to FIG. 23, the processing steps of FIGS. 5C and 5D can be sequentially performed to form a memory film 50 and a first semiconductor channel layer 601 within each memory opening 49, and a dielectric layer stack 50' and a first semiconductor channel layer 601 within each support opening 19. Each memory film 50 within a memory opening 49 contacts an underlying epitaxial channel portion 11. Each dielectric layer stack 50' within a support opening 19 contacts a periphery of a top surface of an underlying semiconductor oxide portion 101, which is one of the second subset of semiconductor oxide portions 101 that remain under the support openings 19. Each first semiconductor channel layer 601 within a memory opening 49 contacts a surface of an underlying epitaxial channel portion 11. Each first semiconductor layer 601 within a support opening 19 contacts a center portion of the top surface of an underlying semiconductor oxide portion 101. The bottom surface of each dielectric layer stack 50' in the support openings 19 can be more proximal to the horizontal plane including the top surface of the semiconductor material layer 10 than the bottom surface of each memory film 50 in the memory openings 49 is to the horizontal plane. The bottom surface of each first semiconductor channel layer 601 in the support openings 19 can be more proximal to the horizontal plane including the top surface of the semiconductor material layer 10 than the bottom surface of each first semiconductor channel layer 601 in the memory openings 49 is to the horizontal plane. The memory films 50 and the dielectric layer stacks 50' can have the same thickness and composition as each other throughout, which is herein referred to as a memory film thickness and composition. The memory film thickness can be uniform for each of the memory films 50 and for each of the dielectric layer stacks 50'. The first semiconductor layers 601 can have the same thickness throughout, which is herein referred to as a first semiconductor layer thickness.

Subsequently, the processing steps of FIG. 5E can be performed to deposit a second semiconductor channel layer 602, which can be a conformal layer.

Figure 24:
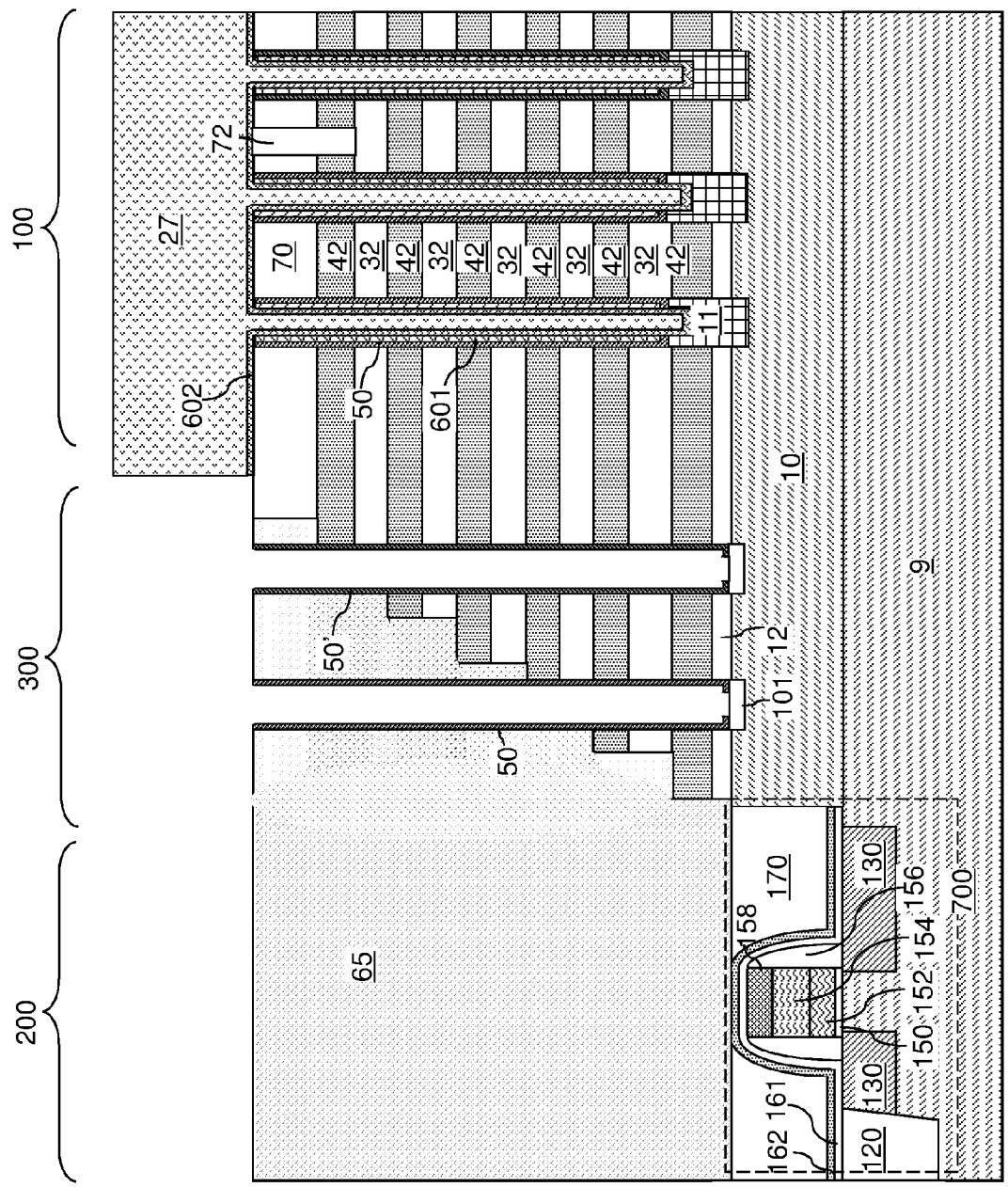
FIG. 24 is a schematic vertical cross-sectional view of the second exemplary structure after removal of the first and second semiconductor channel layers from inside the support openings according to the second embodiment of the present disclosure.

Referring to FIG. 24, the processing steps of FIGS. 6A and 6B can be performed to cover the memory array region 100 with a patterned photoresist layer 27, while the contact region 300 and the peripheral device region 200 are not covered by the patterned photoresist layer 27. The etch process of FIG. 7 can be subsequently performed, which can include, for example, a wet etch process employing a TMY solution or a dry etch process that employs HCl. The portions of the first second semiconductor channel layers (601, 602) in the contact region 300 and the peripheral device region 200 can be removed by the etch process, while the patterned photoresist layer 27 covers and protects the portions of the first and second semiconductor channel layers (601, 602) in the memory array region 100. The photoresist layer 27 can be subsequently removed, for example, by ashing. While the present disclosure is described employing an embodiment in which a first semiconductor channel layer 601 is employed, embodiments are expressly contemplated herein in which the first semiconductor channel layer 601 is omitted.

FIG. 25A shows a portion of the second exemplary structure within a support opening 19 after the processing steps of FIG. 24, and FIG. 25B shows a portion of the second exemplary structure within a memory opening 49 after the processing steps of FIG. 24. Each memory opening 49 includes an instance of an epitaxial channel portion 11, an instance of a memory film 50, an instance of a first semiconductor channel layer 601, and a respective portion of the second semiconductor channel layer 602. A memory cavity 49' is present within each memory opening 49. Each support opening 19 can include an instance of a semiconductor oxide portion 101 (which can have the same thickness throughout) and an instance of a dielectric layer stack 50', which can contact the underlying semiconductor oxide portion 101.

Additional material portions can be subsequently deposited in the memory openings 49 and the support openings 19 to form memory stack structures and support pillar structures in the memory openings 49 and the support openings 19, respectively. For example, a dielectric material can be deposited to form a dielectric core in each memory opening 49 and a dielectric fill material portion in each support opening 19.

Referring to FIGS. 26A and 26B, a dielectric core layer 62L can be deposited in each of the memory cavities 49' and the support cavities 19'. FIG. 26A shows a portion of the second exemplary structure within a support opening 19 after deposition of the dielectric core layer 62L, and FIG. 26B shows a portion of the second exemplary structure within a memory opening 49 after deposition of the dielectric core layer 62L. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIGS. 27A and 27B, horizontal portions of the dielectric core layer 62L and the second semiconductor channel layer 602 located above the horizontal plane including the top surface of the insulating cap layer 70 can be removed by a planarization process, which can include chemical mechanical planarization and/or a recess etch. Subsequently, the dielectric material of the dielectric core layer 62L can be vertically recessed for example, by a recess etch. FIG. 27A shows a portion of the second exemplary structure within a support opening 19 after recessing of the dielectric core layer 62L, and FIG. 27B shows a portion of the second exemplary structure within a memory opening 49 after recessing of the dielectric core layer 62L. The recess etch can be selective to the memory films 50, the dielectric layer stacks 50', the insulating cap layer 70, and optionally to the semiconductor materials of the first and second semiconductor material layers (601, 602). Each remaining portion of the dielectric core layer 62L in a memory opening 49 is herein referred to as a dielectric core 62. Each remaining portion of the dielectric core layer 62L in a support opening 19 is herein referred to as a dielectric fill material portion 62'. The top surfaces of the dielectric cores 62 and the dielectric fill material portions 62' can be located between a horizontal plane including the top surface of the insulating cap layer 70 and a horizontal plane including the bottom surface of the insulating cap layer 70.

Referring to FIGS. 28A and 28B, drain regions 63 can be formed by depositing a doped semiconductor material within each recessed region above the dielectric cores 62, and dummy drain regions 63' can be formed by depositing the doped semiconductor material within each recessed region above the dielectric fill material portions 62'. FIG. 28A shows a portion of the second exemplary structure within a support opening 19 after formation of the dummy drain regions 63, and FIG. 28B shows a portion of the second exemplary structure within a memory opening 49 after formation of the drain regions 63. Specifically, a doped semiconductor material can be simultaneously deposited above the dielectric cores 62 to form the drain regions 63 and above the dielectric fill material portions 62' to form the dummy drain regions 63'. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63 and the dummy drain regions 63'.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of an epitaxial channel portion 11 (if present), a memory stack structure 55, a dielectric core 62, and a drain region 63 within a memory opening 49 is herein referred to as a memory opening fill structure (11, 55, 62, 63). Each combination of a semiconductor oxide portion 101, a dielectric layer stack 50', a dielectric fill material portion 62', and a dummy drain region 63' within each support opening 19 fills the respective support openings 19, and constitutes a support pillar structure 20'.

Figure 29:
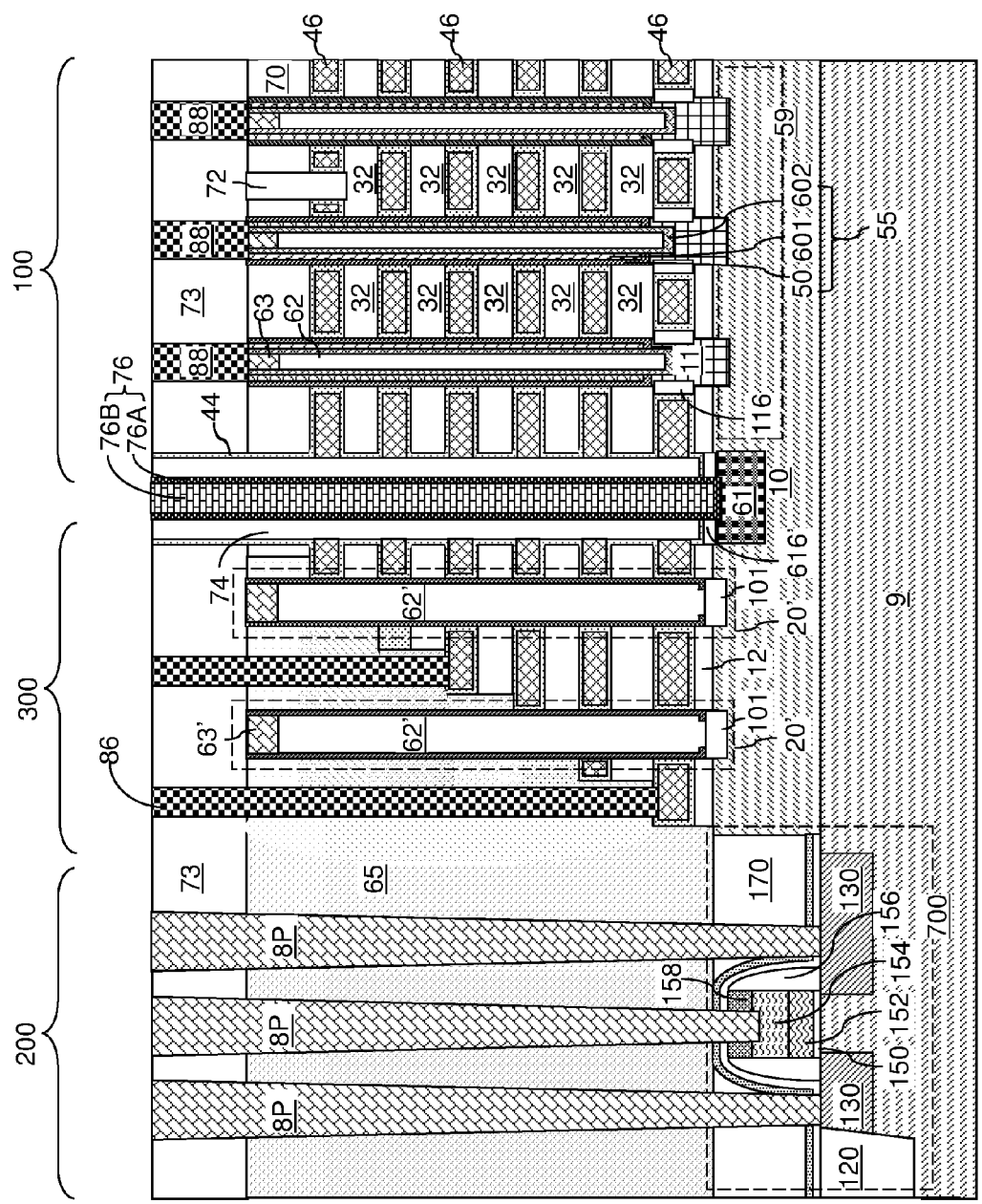
FIG. 29 is a schematic vertical cross-sectional view of the second exemplary structure after formation of additional contact via structures according to the second embodiment of the present disclosure.

Referring to FIG. 29, the processing steps of FIGS. 13A, 13B, 14, 15A-15D, 16, 17, 18A, 18B, 19A, and 19B can be sequentially performed to form electrically conductive layers 46 and various contact via structures (76, 88, 86, 8P).

Each of the first and second exemplary structures can include a three-dimensional memory device. The three-dimensional memory device can include an alternating stack (32, 46) of insulating layers 32 and electrically conductive layers 46 located over a substrate (9, 10); memory stack structures 55 extending through the alternating stack (32, 46), wherein each of the memory stack structures 55 comprises a memory film 50, a vertical semiconductor channel 60 contacting an inner sidewall of the memory film 50, and a dielectric core 62 contacting an inner sidewall of the vertical semiconductor channel 60; and support pillar structures (20 or 20') extending through the alternating stack (32, 46) and laterally spaced from the memory stack structures 55, wherein each of the support pillar structures (20 or 20') comprises a dielectric layer stack 50' and a dielectric fill material portion 62' that contacts an inner sidewall of the dielectric layer stack 50'.

In one embodiment, each dielectric layer stack 50' and each memory film 20 include an identical set of dielectric material layers (52, 54, 56). In one embodiment, the memory film 50 comprises a backside blocking dielectric layer 52, a charge trapping layer 54, and a tunneling dielectric layer 56.

In one embodiment, each dielectric core 62 and each of the dielectric fill material portions 62' extend through more than 50% of all layers (as counted from the bottommost layer to the topmost layer) within the alternating stack (32, 46).

In one embodiment, the dielectric fill material portions 62' of the support pillar structures (20 or 20') are more proximal to a top surface of the substrate (9, 10) than the dielectric cores 62 are to the top surface of the substrate (9, 10). In one embodiment, each of the memory films 50 and the dielectric layer stacks 50' extends above a horizontal plane including a top surface of a topmost electrically conductive layer 46 within the alternating stack (32, 46). In one embodiment, the dielectric layer stacks 50' are more proximal to a top surface of the substrate (9, 10) than the memory films 50 are to the top surface of the substrate (9, 10).

In one embodiment, a top surface of each dielectric core 62 contacts a respective drain region 63; a top surface of each dielectric fill material portion 62' contacts a respective dummy drain region 63' having a same composition as the drain regions 63; each drain region 63 contacts a top end of a respective vertical semiconductor channel 60; and each dummy drain region 63' contacts an inner sidewall of a respective dielectric fill material portion 62'.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). The support pillar structures (20 or 20') extend through the stepped surfaces and through a retro-stepped dielectric material portion 65 that overlies the stepped surfaces.

In one embodiment, an epitaxial channel portion 11 is disposed between each vertical semiconductor channel 60 and a semiconductor material portion (e.g., the semiconductor material layer 10) within the substrate (9, 10). A tubular dielectric spacer 116 laterally surrounds, and contacts, a respective epitaxial channel portion 11. The three-dimensional memory device can further include a backside blocking dielectric layer 44 disposed between each neighboring pair of an electrically conductive layer 46 and an insulating layer 32 and extending from a bottommost layer within the alternating stack (32, 46) to a topmost layer within the alternating stack (32, 46). The epitaxial channel portions 11 are laterally spaced from the backside blocking dielectric layer 44 by the tubular dielectric spacers 116.

In the first exemplary structure, an epitaxial pedestal 11' comprising a same material as the epitaxial channel portions 11 can be present between each dielectric fill material portion 62' and the semiconductor material portion (such as the semiconductor material layer 10) of the substrate (9, 10).

A top surface of the epitaxial channel portion 11 extends farther away from the semiconductor material portion 10 of the substrate (9, 10) than a top surface of the epitaxial pedestal 11'.

In the second exemplary structure, a bottom surface of each dielectric layer stack 50' contacts a semiconductor oxide portion 101 which contact the semiconductor material portion (such as the semiconductor material layer 10) within the substrate (9, 10). In one embodiment, each semiconductor oxide portion 101 contacts a bottom surface of a respective dielectric fill material portion 62'.

Each of the first and second exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

The various support pillar structures (20, 20') does not include any semiconductor material between the levels of the electrically conductive layers 46. The semiconductor materials deposited in the support openings 19 during formation of the first and second semiconductor material layers (601, 602) are removed from within the support openings 19 at the processing steps of FIG. 7 or at the processing steps of FIG. 24. Further, deposition of a semiconductor material in the support openings 19 during formation of the epitaxial channel portions 11 in the memory openings 49 can be avoided (as in the second embodiment), or deposited material in the support openings 19 formed during formation of the epitaxial channel portions 11 in the memory openings 49 can be removed below the top surface of the bottommost sacrificial material layer 42, and preferably, below the bottom surface of the bottommost sacrificial material layer 42. Due to the lack of any conductive material or any semiconductor material above a horizontal plane including the top surface of the bottommost electrically conductive layer 46, vertical leakage paths through the support pillar structures (20 or 20') can be prevented.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   memory stack structures extending through the alternating stack, wherein each of the memory stack structures comprises a memory film, a vertical semiconductor channel contacting an inner sidewall of the memory film, and a dielectric core contacting an inner sidewall of the vertical semiconductor channel; and
   support pillar structures extending through the alternating stack and laterally spaced from the memory stack structures, wherein each of the support pillar structures comprises a dielectric layer stack and a dielectric fill material portion that contacts an inner sidewall of the dielectric layer stack; wherein:
   an epitaxial channel portion is disposed between each vertical semiconductor channel and a semiconductor material portion of the substrate; and
   a tubular dielectric spacer laterally surrounds, and contacts, a respective epitaxial channel portion; and one of:
   (i) a first feature wherein an epitaxial pedestal comprising a same material as the epitaxial channel portion is present between each dielectric fill material portion and the semiconductor material portion the substrate; and
   a top surface of the epitaxial channel portion extends farther away from the semiconductor material portion of the substrate than a top surface of the epitaxial pedestal; or
   (ii) a second feature wherein a bottom surface of each dielectric layer stack contacts a semiconductor oxide portion which contacts the semiconductor material portion of the substrate.

2. The three-dimensional memory device of claim 1, wherein each dielectric layer stack and each memory film include an identical set of dielectric material layers.

3. The three-dimensional memory device of claim 2, wherein the memory film comprises a backside blocking dielectric layer, a charge trapping layer, and a tunneling dielectric layer.

4. The three-dimensional memory device of claim 1, wherein each dielectric core and each of the dielectric fill material portions extend through more than 50% of all layers within the alternating stack.

5. The three-dimensional memory device of claim 1, wherein:
   the dielectric fill material portions of the support pillar structures are more proximal to a top surface of the substrate than the dielectric cores are to the top surface of the substrate; and the dielectric layer stacks are more proximal to the top surface of the substrate than the memory films are to the top surface of the substrate.

6. The three-dimensional memory device of claim 1, wherein each of the memory films and the dielectric layer stacks extends above a horizontal plane including a top surface of a topmost electrically conductive layer within the alternating stack.

7. The three-dimensional memory device of claim 1, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
the support pillar structures extend through the stepped surfaces and through a retro-stepped dielectric material portion that overlies the stepped surfaces.

8. The three-dimensional memory device of claim 1, wherein the three-dimensional memory device comprises the first feature.

9. The three-dimensional memory device of claim 1, wherein the three-dimensional memory device comprises the second feature.

10. The three-dimensional memory device of claim 9, wherein each semiconductor oxide portion contacts a bottom surface of a respective dielectric fill material portion, such that no epitaxial channel material is present in between the dielectric fill material portion and the semiconductor material portion.

11. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

12. A three-dimensional memory device comprising:
an alternating stack of insulating layers and electrically conductive layers located over a substrate;
memory stack structures extending through the alternating stack, wherein each of the memory stack structures comprises a memory film, a vertical semiconductor channel contacting an inner sidewall of the memory film, and a dielectric core contacting an inner sidewall of the vertical semiconductor channel; and
support pillar structures extending through the alternating stack and laterally spaced from the memory stack structures, wherein each of the support pillar structures comprises a dielectric layer stack and a dielectric fill material portion that contacts an inner sidewall of the dielectric layer stack; wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

13. The three-dimensional memory device of claim 12, wherein each dielectric layer stack and each memory film include an identical set of dielectric material layers.

14. The three-dimensional memory device of claim 13, wherein the memory film comprises a backside blocking dielectric layer, a charge trapping layer, and a tunneling dielectric layer.

15. The three-dimensional memory device of claim 12, wherein each dielectric core and each of the dielectric fill material portions extend through more than 50% of all layers within the alternating stack.

16. The three-dimensional memory device of claim 12, wherein:

the dielectric fill material portions of the support pillar structures are more proximal to a top surface of the substrate than the dielectric cores are to the top surface of the substrate; and
the dielectric layer stacks are more proximal to the top surface of the substrate than the memory films are to the top surface of the substrate.

17. The three-dimensional memory device of claim 12, wherein each of the memory films and the dielectric layer stacks extends above a horizontal plane including a top surface of a topmost electrically conductive layer within the alternating stack.

18. The three-dimensional memory device of claim 12, wherein:
a top surface of each dielectric core contacts a respective drain region;
a top surface of each dielectric fill material portion contacts a respective dummy drain region having a same composition as the drain regions;
each drain region contacts a top end of a respective vertical semiconductor channel; and
each dummy drain region contacts an inner sidewall of a respective dielectric fill material portion.

19. The three-dimensional memory device of claim 12, wherein:
the alternating stack comprises a terrace region in which each electrically conductive layer other than a topmost electrically conductive layer within the alternating stack laterally extends farther than any overlying electrically conductive layer within the alternating stack;
the terrace region includes stepped surfaces of the alternating stack that continuously extend from a bottommost layer within the alternating stack to a topmost layer within the alternating stack; and
the support pillar structures extend through the stepped surfaces and through a retro-stepped dielectric material portion that overlies the stepped surfaces.

20. The three-dimensional memory device of claim 12, wherein:
an epitaxial channel portion is disposed between each vertical semiconductor channel and a semiconductor material portion of the substrate; and
a tubular dielectric spacer laterally surrounds, and contacts, a respective epitaxial channel portion.

21. The three-dimensional memory device of claim 20, wherein:
an epitaxial pedestal comprising a same material as the epitaxial channel portion is present between each dielectric fill material portion and the semiconductor material portion the substrate; and
a top surface of the epitaxial channel portion extends farther away from the semiconductor material portion of the substrate than a top surface of the epitaxial pedestal.

22. The three-dimensional memory device of claim 20, wherein a bottom surface of each dielectric layer stack contacts a semiconductor oxide portion which contact the semiconductor material portion of the substrate.

23. The three-dimensional memory device of claim 22, wherein each semiconductor oxide portion contacts a bottom surface of a respective dielectric fill material portion, such that no epitaxial channel material is present in between the dielectric fill material portion and the semiconductor material portion.

\* \* \* \* \*